United States Patent
Yun et al.

(10) Patent No.: US 11,864,309 B2
(45) Date of Patent: Jan. 2, 2024

(54) ANTENNA STRUCTURE COMPRISING TRANSMISSION LINE FOR TRANSITIONING AND FEEDING BETWEEN MULTIPLE FREQUENCY BANDS AND ELECTRONIC DEVICE COMPRISING SAME

(71) Applicant: Samsung Electronics Co., Ltd., Gyeonggi-do (KR)

(72) Inventors: Sumin Yun, Gyeonggi-do (KR); Dongyeon Kim, Gyeonggi-do (KR); Seongjin Park, Gyeonggi-do (KR); Sehyun Park, Gyeonggi-do (KR); Woomin Jang, Gyeonggi-do (KR); Myunghun Jeong, Gyeonggi-do (KR); Jehun Jong, Gyeonggi-do (KR); Jaehoon Jo, Gyeonggi-do (KR)

(73) Assignee: Samsung Electronics Co., Ltd

( * ) Notice: Subject to any disclaimer, the term of this patent is extended or adjusted under 35 U.S.C. 154(b) by 308 days.

(21) Appl. No.: 17/440,474

(22) PCT Filed: Mar. 20, 2020

(86) PCT No.: PCT/KR2020/003871
§ 371 (c)(1),
(2) Date: Sep. 17, 2021

(87) PCT Pub. No.: WO2020/190091
PCT Pub. Date: Sep. 24, 2020

(65) Prior Publication Data
US 2022/0159826 A1 May 19, 2022

(30) Foreign Application Priority Data
Mar. 21, 2019 (KR) .................. 10-2019-0032354

(51) Int. Cl.
*H05K 1/02* (2006.01)
*H01Q 1/24* (2006.01)
(Continued)

(52) U.S. Cl.
CPC .......... *H05K 1/0237* (2013.01); *H01Q 1/243* (2013.01); *H01Q 5/328* (2015.01); *H01Q 13/02* (2013.01);
(Continued)

(58) Field of Classification Search
CPC .......... H01Q 1/38; H01Q 1/44; H01Q 1/243; H01Q 5/328; H01Q 13/02; H01Q 1/46;
(Continued)

(56) References Cited

U.S. PATENT DOCUMENTS 7,444,734 B2  11/2008  Gaucher et al.
7,999,753 B2   8/2011  Gaucher et al.
(Continued)

FOREIGN PATENT DOCUMENTS

KR  10-2018-0131473   12/2018
KR  10-2018-0134528   12/2018
(Continued)

OTHER PUBLICATIONS

PCT/ISA/210 Search Report issued on PCT/KR2020/003871, dated Jul. 10, 2020, pp. 5.
(Continued)

*Primary Examiner* — Vibol Tan
(74) *Attorney, Agent, or Firm* — The Farrell Law Firm, P.C.

(57) ABSTRACT

Disclosed is an electronic device comprising: a housing comprising a first plate, a second plate, and a side member, the side member having a first part comprising a first surface, a second surface, a through-hole formed from the first surface to the second surface in a first direction in which
(Continued)

same penetrates the side member, and a nonconductive material; a display; a printed circuit board comprising a third surface, a fourth surface, a first conductive layer, a second conductive layer, a feeding line, a conductive pattern, a conductive via, a third conductive layer disposed between the first conductive layer and the second conductive layer, a fourth conductive layer disposed between the first conductive layer and the third conductive layer, multiple first side vias formed so as to electrically connect the first conductive layer and the third conductive layer and to be spaced apart from the conductive via by a first distance in a second direction, which is perpendicular to the first direction, and in which same face away from the through-hole and the slit, and multiple second side vias formed so as to electrically connect the third conductive layer and the fourth conductive layer and to be spaced apart from the conductive via by a second distance, which is different from the first distance, in the second direction; and at least one wireless communication circuit. Various other embodiments recognizable from the specification are also possible.

15 Claims, 22 Drawing Sheets

(51) Int. Cl.
*H01Q 5/328* (2015.01)
*H01Q 13/02* (2006.01)
*H05K 1/11* (2006.01)

(52) U.S. Cl.
CPC ... H05K 1/115 (2013.01); *H05K 2201/10098* (2013.01)

(58) Field of Classification Search
CPC .... H05K 1/0243; H05K 1/141; H05K 5/0017; H05K 7/1427; H05K 5/0217; H05K 1/0237; H05K 1/115; H05K 2201/10098; H01P 3/12; H01P 3/121; H03H 9/70; H04B 1/00; H04B 1/0064; H04M 1/02; H04M 1/0249; H04M 1/0266; H04M 1/0277

See application file for complete search history.

(56) References Cited

U.S. PATENT DOCUMENTS

| | | | |
|---|---|---|---|
| 8,723,736 B2 | 5/2014 | Park et al. | |
| 9,819,092 B2 | 11/2017 | Lo Hine Tong et al. | |
| 10,530,041 B2* | 1/2020 | Jung | H01Q 5/328 |
| 10,686,254 B2* | 6/2020 | Cai | H01Q 13/103 |
| 11,056,769 B2* | 7/2021 | Jeon | H01Q 1/48 |
| 11,108,155 B2* | 8/2021 | Gomez Angulo | H04B 1/18 |
| 11,189,906 B2* | 11/2021 | Park | H01Q 3/40 |
| 11,202,365 B2* | 12/2021 | Kim | H01Q 21/08 |
| 11,374,310 B2* | 6/2022 | Kim | H05K 3/282 |
| 11,558,496 B2* | 1/2023 | Jang | H01Q 1/38 |
| 11,757,147 B2* | 9/2023 | Xu | H01M 10/637 |
| | | | 180/65.1 |
| 2005/0122265 A1 | 6/2005 | Gaucher et al. | |
| 2008/0272977 A1 | 11/2008 | Gaucher et al. | |
| 2012/0139796 A1 | 6/2012 | Park et al. | |
| 2014/0111393 A1 | 4/2014 | Lo Hine Tong et al. | |
| 2018/0358686 A1 | 12/2018 | Park | |
| 2018/0366831 A1 | 12/2018 | Cai et al. | |

FOREIGN PATENT DOCUMENTS

| | | |
|---|---|---|
| KR | 10-2019-0009232 | 1/2019 |
| KR | 10-2020-0091622 | 7/2020 |

OTHER PUBLICATIONS

PCT/ISA/237 Written Opinion issued on PCT/KR2020/003871, dated Jul. 10, 2020, pp. 4.

* cited by examiner

ANTENNA STRUCTURE COMPRISING TRANSMISSION LINE FOR TRANSITIONING AND FEEDING BETWEEN MULTIPLE FREQUENCY BANDS AND ELECTRONIC DEVICE COMPRISING SAME

PRIORITY

This application is a National Phase Entry of PCT International Application No. PCT/KR2020/003871, which was filed on Mar. 20, 2020, and claims priority to Korean Patent Application No. 10-2019-0032354, which was filed on Mar. 21, 2019, the entire content of each of which is incorporated herein by reference.

TECHNICAL FIELD

Embodiments of the disclosure relate to an antenna structure including a transmission line capable of transitioning and feeding a plurality of frequency bands and an electronic device including the antenna structure.

BACKGROUND ART

As mobile communication technologies develop, an electronic device that is equipped with an antenna is being widely supplied. The electronic device may transmit and/or receive a radio frequency (RF) signal including a voice signal or data (e.g., a message, a photo, a video, a music file, or a game) by using the antenna. The electronic device may perform communication by using a high frequency (e.g., 5G communication or millimeter wave). When the communication is performed by using the high frequency, an array antenna may be applied to overcome high transmission loss.

DISCLOSURE

Technical Problem

Meanwhile, nowadays, an electronic device may include a metal frame disposed around an antenna. In the case where the metal frame is disposed, the metal frame itself may be utilized as an antenna radiator to prevent radiation patterns of signals radiated from the antenna from being distorted. A metal frame of a horn shape may have a structure in which an aperture of an antenna radiator is disposed at the outermost portion of the electronic device.

The metal frame of the horn shape may feed a signal by using a waveguide as a portion of a transmission line for the purpose of blocking an influence of any other metal lines included in a printed circuit board of the electronic device. Because the waveguide transfers a signal in a mode different from a transmission mode of a signal output from a wireless communication circuit, it may be possible to perform an operation of transition to different modes within the transmission line.

A quarter wave shorting stub may be used to transition a transmission mode in the transmission line included in the printed circuit board. However, in the case of the quarter wave shorting stub, because a transition is made only in a specific band, it may not be easy to transition a plurality of frequency bands.

Also, an opened waveguide may be used to transition a transmission mode on the transmission line included in the printed circuit board. However, in the case where the metal frame is disposed to make contact with the opened waveguide, it may not be easy to implement an opened circuit in a high-frequency band.

Embodiments of the disclosure are directed to provide an antenna structure capable of transitioning and feeding a plurality of frequency bands and an electronic device including the antenna structure.

Technical Solution

An electronic device according to an embodiment of the disclosure may include a housing that includes a first plate, a second plate facing away from the first plate, and a side member surrounding a space between the first plate and the second plate, connected with the second plate or integrally formed with the second plate, and including a conductive material, wherein a first portion of the side member includes a first surface facing an exterior of the housing, a second surface facing an interior of the housing, a through hole formed in a first direction being a direction passing through the side member from the first surface to the second surface, and a non-conductive material inserted into the through hole, a display that is viewable through at least a portion of the first plate, a printed circuit board that is disposed in the interior of the housing, wherein the printed circuit board includes a third surface facing the second surface, a fourth surface facing away from the third surface, a first conductive layer disposed closer to the third surface than to the fourth surface and including a slit formed to face the through hole, a second conductive layer disposed closer to the fourth surface than to the first conductive layer, a feeding line interposed between the first conductive layer and the second conductive layer, a conductive pattern interposed between the feeding line and the first conductive layer and capacitively coupled with the first conductive layer, a conductive via connecting the feeding line and the conductive pattern, a third conductive layer interposed between the first conductive layer and the second conductive layer, a fourth conductive layer interposed between the first conductive layer and the third conductive layer, a plurality of first side vias electrically connecting the first conductive layer and the third conductive layer and formed to be spaced from the conductive via in a second direction, which is perpendicular to the first direction and is a direction facing away from the through hole and the slit, as much as a first distance, and a plurality of second side vias electrically connecting the third conductive layer and the fourth conductive layer and formed to be spaced from the conductive via in the second direction as much as a second distance different from the first distance, and a wireless communication circuit that is electrically connected with the feeding line and transmits and/or receives signals each having a frequency between 3 GHz and 100 GHz.

An electronic device according to another embodiment of the disclosure may include a housing that includes a first plate, a second plate facing away from the first plate, and a side member surrounding a space between the first plate and the second plate, connected with the second plate or integrally formed with the second plate, and including a conductive material, wherein a first portion of the side member includes a first surface facing an exterior of the housing, and a second surface facing away from the first surface, a printed circuit board that is disposed in the interior of the housing, wherein the printed circuit board includes a third surface facing the second surface, a fourth surface facing away from the third surface, a first conductive layer disposed closer to the third surface than to the fourth surface and in which a through hole is formed in a first direction, a second conductive layer disposed closer to the fourth surface than to the first conductive layer, a feeding line interposed between the first conductive layer and the second conductive layer, a conductive via connecting the feeding line and the first conductive layer, a third conductive layer interposed between the first conductive layer and the second conductive layer, a fourth conductive layer interposed between the first conductive layer and the third conductive layer, a plurality of third side vias electrically connecting the first conductive layer and the third conductive layer, formed to be spaced from the conductive via in a second direction, which is perpendicular to the first direction and is a direction facing away from the through hole, and formed to be spaced from the fourth conductive layer, and a plurality of fourth side vias electrically connecting the first conductive layer and the fourth conductive layer, spaced from the conductive via in the second direction, and formed more adjacent to the conductive via than the plurality of third side vias, and a wireless communication circuit that is electrically connected with the feeding line and transmits and/or receives signals each having a frequency between 3 GHz and 100 GHz.

An electronic device according to another embodiment may include a printed circuit board that is disposed in the electronic device, and at least one wireless communication circuit that is electrically connected with the printed circuit board and transmits and/or receives signals each having a frequency between 3 GHz and 100 GHz. The printed circuit board may include a third surface that is adjacent to an outer surface of the electronic device, a fourth surface that faces away from the third surface, a first conductive layer that is disposed closer to the third surface than to the fourth surface and in which a through hole is formed in a first direction, a second conductive layer that is disposed closer to the fourth surface than to the first conductive layer, a feeding line that is interposed between the first conductive layer and the second conductive layer, a conductive pattern that is interposed between the feeding line and the first conductive layer and is capacitively coupled with the first conductive layer, a conductive via that connects the feeding line and the conductive pattern, a third conductive layer that is interposed between the first conductive layer and the second conductive layer, a fourth conductive layer that is interposed between the first conductive layer and the third conductive layer, a first shorting stub that has a first distance from the conductive via in a second direction being perpendicular to the first direction and facing away from the through hole, and a second shorting stub that has a second distance different from the first distance from the conductive via in the second direction.

Advantageous Effects

According to various embodiment of the disclosure, a signal may be fed to a metal frame through a waveguide by allowing signals in multiple frequency bands to transition in a transmission line.

Besides, a variety of effects directly or indirectly understood through this disclosure may be provided.

With regard to description of drawings, the same or similar components will be marked by the same or similar reference signs.

MODE FOR INVENTION

Hereinafter, various embodiments of the disclosure may be described with reference to accompanying drawings. However, those of ordinary skill in the art will recognize that modification, equivalent, and/or alternative on various embodiments described herein can be variously made without departing from the scope and spirit of the disclosure.

Figure 1:
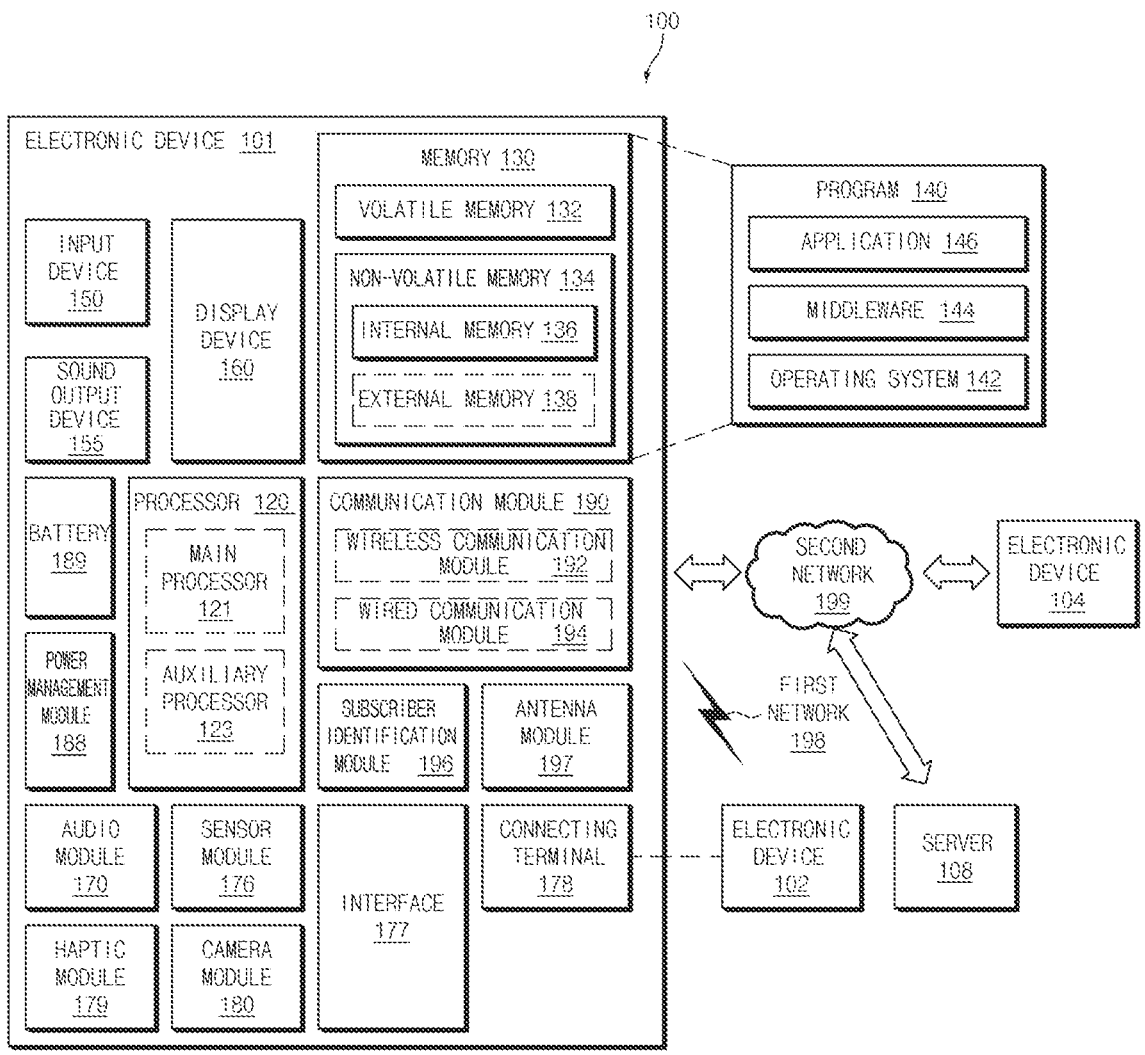
FIG. 1 is a block diagram illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
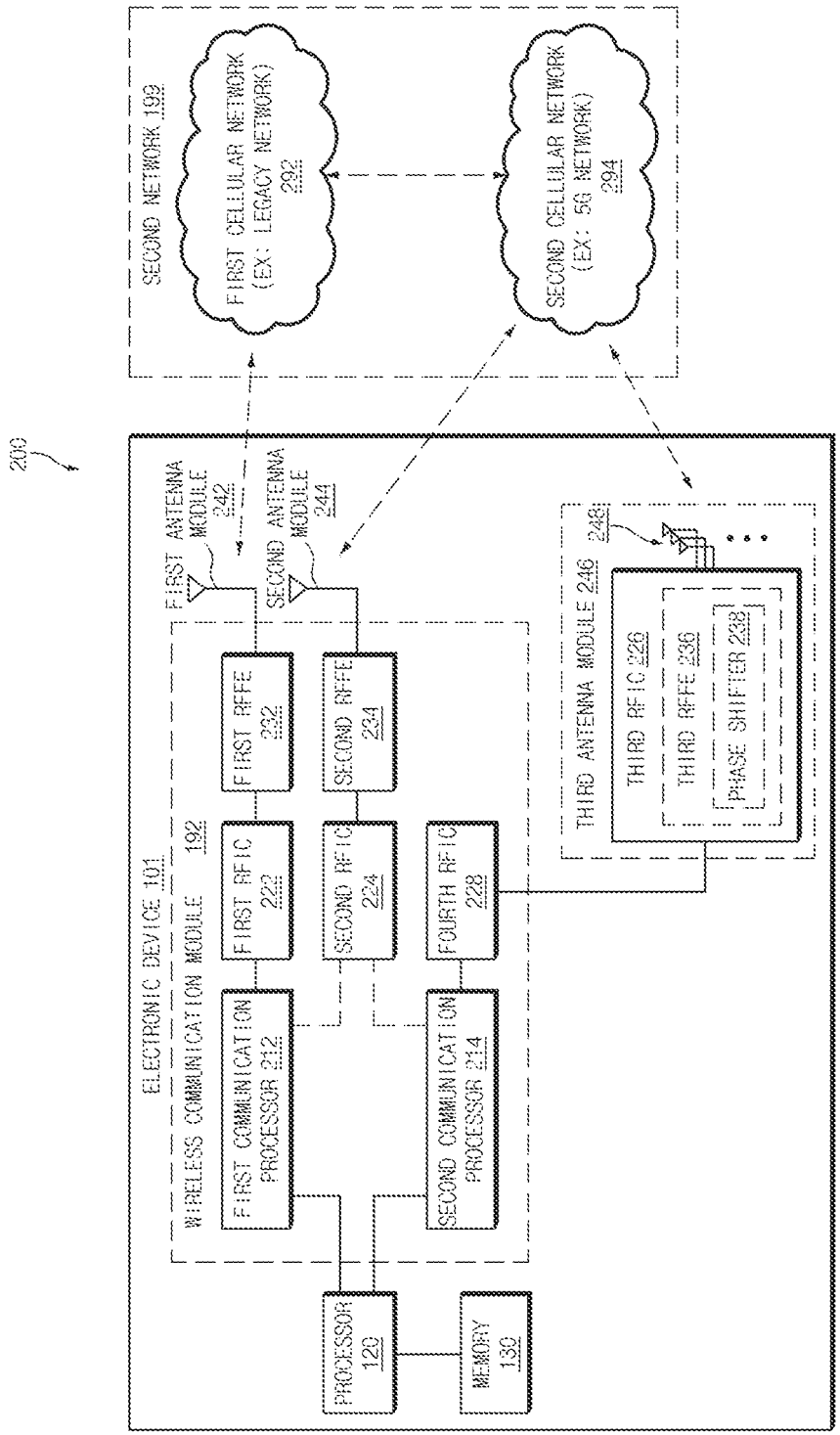
FIG. 2 is a block diagram of an electronic device for supporting legacy network communication and 5G network communication, according to various embodiments.

FIG. 2 is a block diagram 200 of the electronic device 101 for supporting legacy network communication and 5G network communication, according to various embodiments. Referring to FIG. 2, the electronic device 101 may include a first communication processor 212, a second communication processor 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include the processor 120 and the memory 130. The network 199 may include a first network 292 and a second network 294. According to another embodiment, the electronic device 101 may further include at least one component of the components illustrated in FIG. 1, and the network 199 may further include at least another network. According to an embodiment, the first communication processor 212, the second communication processor 214, the first RFIC 222, the second RFIC 224, the fourth RFIC 228, the first RFFE 232, and the second RFFE 234 may form at least part of the wireless communication module 192. According to another embodiment, the fourth RFIC 228 may be omitted or may be included as a part of the third RFIC 226.

The first communication processor 212 may establish a communication channel for a band to be used for wireless communication with the first network 292 and may support legacy network communication through the established communication channel. According to various embodiments, the first network may be a legacy network including a $2^{nd}$ generation (2G), 3G, 4G, or long term evolution (LTE) network. The second communication processor 214 may establish a communication channel corresponding to a specified band (e.g., ranging from approximately 6 GHz to approximately 60 GHz) of bands to be used for wireless communication with the second network 294 and may support 5G network communication through the established communication channel. According to various embodiments, the second network 294 may be a 5G network defined in 3GPP. Additionally, according to an embodiment, the first communication processor 212 or the second communication processor 214 may establish a communication channel corresponding to another specified band (e.g., approximately 6 GHz or lower) of the bands to be used for wireless communication with the second network 294 and may support 5G network communication through the established communication channel. According to an embodiment, the first communication processor 212 and the second communication processor 214 may be implemented within a single chip or a single package. According to various embodiments, the first communication processor 212 or the second communication processor 214 may be implemented within a single chip or a single package together with the processor 120, the auxiliary processor 123, or the communication module 190.

In the case of transmitting a signal, the first RFIC 222 may convert a baseband signal generated by the first communication processor 212 into a radio frequency (RF) signal of approximately 700 MHz to approximately 3 GHz that is used in the first network 292 (e.g., a legacy network). In the case of receiving a signal, an RF signal may be obtained from the first network 292 (e.g., a legacy network) through an antenna (e.g., the first antenna module 242) and may be pre-processed through an RFFE (e.g., the first RFFE 232). The first RFIC 222 may convert the preprocessed RF signal into a baseband signal so as to be processed by the first communication processor 212.

In the case of transmitting a signal, the second RFIC 224 may convert a baseband signal generated by the first communication processor 212 or the second communication processor 214 into an RF signal (hereinafter referred to as a "5G Sub6 RF signal") in a Sub6 band (e.g., approximately 6 GHz or lower) used in the second network 294 (e.g., a 5G network). In the case of receiving a signal, the 5G Sub6 RF signal may be obtained from the second network 294 (e.g., a 5G network) through an antenna (e.g., the second antenna module 244) and may be pre-processed through an RFFE (e.g., the second RFFE 234). The second RFIC 224 may convert the preprocessed 5G Sub6 RF signal into a baseband signal so as to be processed by a corresponding communication processor of the first communication processor 212 or the second communication processor 214.

The third RFIC 226 may convert a baseband signal generated by the second communication processor 214 into an RF signal (hereinafter referred to as a "5G Above6 RF signal") in a 5G Above6 band (e.g., approximately 6 GHz to approximately 60 GHz) to be used in the second network 294 (e.g., a 5G network). In the case of receiving a signal, the 5G Above6 RF signal may be obtained from the second network 294 (e.g., a 5G network) through an antenna (e.g., the antenna 248) and may be pre-processed through a third RFFE 236. The third RFIC 226 may convert the preprocessed 5G Above 6 RF signal into a baseband signal so as to be processed by the second communication processor 214. According to an embodiment, the third RFFE 236 may be implemented as a part of the third RFIC 226.

According to an embodiment, the electronic device 101 may include the fourth RFIC 228 independently of the third RFIC 226 or as at least part of the third RFIC 226. In this case, the fourth RFIC 228 may convert a baseband signal generated by the second communication processor 214 into an RF signal (hereinafter referred to as an "IF signal") in an intermediate frequency band (e.g., approximately 9 GHz to approximately 11 GHz) and may provide the IF signal to the third RFIC 226. The third RFIC 226 may convert the IF signal into the 5G Above6 RF signal. In the case of receiving a signal, the 5G Above6 RF signal may be received from the second network 294 (e.g., a 5G network) through an antenna (e.g., the antenna 248) and may be converted into an IF signal by the third RFIC 226. The fourth RFIC 228 may convert the IF signal into a baseband signal to be processed by the second communication processor 214.

According to an embodiment, the first RFIC 222 and the second RFIC 224 may be implemented as at least part of a single package or a single chip. According to an embodiment, the first RFFE 232 and the second RFFE 234 may be implemented as at least part of a single chip or a single package. According to an embodiment, at least one of the first antenna module 242 or the second antenna module 244 may be omitted or may be combined with any other antenna module to process RF signals in a plurality of bands.

According to an embodiment, the third RFIC 226 and the antenna 248 may be disposed on the same substrate to form a third antenna module 246. For example, the wireless communication module 192 or the processor 120 may be disposed on a first substrate (e.g., a main PCB). In this case, the third RFIC 226 may be disposed in a partial region (e.g., on a lower surface) of a second substrate (e.g., a sub PCB) independent of the first substrate, and the antenna 248 may be disposed in another partial region (e.g., on an upper surface) of the second substrate. As such, the third antenna module 246 may be formed. According to an embodiment, the antenna 248 may include, for example, an antenna array capable of being used for beamforming. As the third RFIC 226 and the antenna 248 are disposed at the same substrate, it may be possible to decrease a length of a transmission line between the third RFIC 226 and the antenna 248. For example, the decrease in the transmission line may make it possible to prevent a signal in a high-frequency band (e.g., approximately 6 GHz to approximately 60 GHz) used for the 5G network communication from being lost (or attenuated) due to the transmission line. As such, the electronic device 101 may improve the quality or speed of communication with the second network 294 (e.g., a 5G network).

The second network 294 (e.g., a 5G network) may be used independently of the first network 292 (e.g., a legacy network) (e.g., this scheme being called "stand-alone (SA)") or may be used in a state of being connected with the first network 292 (e.g., this scheme being called "non-stand alone (NSA)"). For example, only an access network (e.g., a 5G radio access network (RAN) or a next generation RAN (NG RAN)) may be present in the 5G network, and a core network (e.g., a next generation core (NGC)) may be absent from the 5G network. In this case, the electronic device 101 may access the access network of the 5G network and may then access an external network (e.g., Internet) under control of a core network (e.g., an evolved packed core (EPC)) of the legacy network. Protocol information (e.g., LTE protocol information) for communication with the legacy network or protocol information (e.g., New Radio (NR) protocol information) for communication with the 5G network may be stored in the memory 130 so as to be accessed by any other component (e.g., the processor 120, the first communication processor 212, or the second communication processor 214).

Figure 3A:
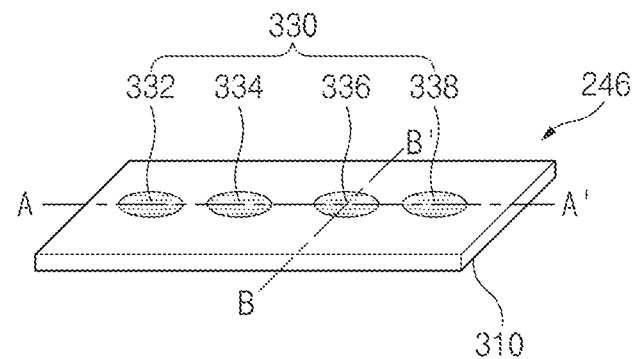
FIG. 3 is views illustrating a third antenna module described with reference to FIG. 2.
Figure 3B:
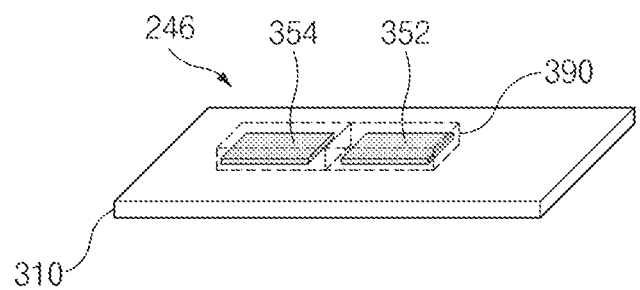
Figure 3C:
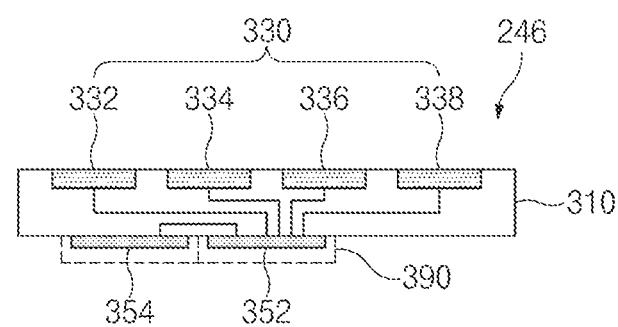

FIGS. 3A to 3C illustrates an embodiment of the third antenna module 246 described with reference to FIG. 2, for example. FIG. 3A is a perspective view of the third antenna module 246 when viewed from one side, and FIG. 3B is a perspective view of the third antenna module 246 when viewed from another side. FIG. 3C is a cross-sectional view of the third antenna module 246 taken along line A-A' of FIG. 3A.

Referring to FIG. 3, in an embodiment, the third antenna module 246 may include a printed circuit board 310, an antenna array 330, a radio frequency integrated circuit (RFIC) 352, a power manage integrated circuit (PMIC) 354, and a module interface. Selectively, the third antenna module 246 may further include a shielding member 390. In various embodiments, at least one of the above components may be omitted, or at least two of the components may be integrally formed.

The printed circuit board 310 may include a plurality of conductive layers and a plurality of non-conductive layers, and the conductive layers and the non-conductive layers may be alternately stacked. The printed circuit board 310 may provide an electrical connection between the printed circuit board 310 and/or various electronic components disposed thereon by using wires and conductive vias formed in the conductive layers.

The antenna array 330 (e.g., 248 of FIG. 2) may include a plurality of antenna elements 332, 334, 336, and 338 disposed to form a directional beam. The antenna elements may be formed on a first surface of the printed circuit board 310, as illustrated. According to another embodiment, the antenna array 330 may be formed within the printed circuit board 310. According to embodiments, the antenna array 330 may include a plurality of antenna arrays (e.g., a dipole antenna array and/or a patch antenna array) that are identical or different in shape or kind.

The RFIC 352 (e.g., 226 of FIG. 2) may be disposed in another region (e.g., on a second surface facing away from the first surface) of the printed circuit board 310 so as to be spaced from the antenna array 330. The RFIC may be configured to process a signal in a selected frequency band, which is transmitted/received through the antenna array 330. According to an embodiment, in the case of transmitting a signal, the RFIC 352 may convert a baseband signal obtained from a communication processor (not illustrated) into an RF signal in a specified band. In the case of receiving a signal, the RFIC 352 may convert an RF signal received through the antenna array 330 into a baseband signal and may provide the baseband signal to the communication processor.

According to another embodiment, in the case of transmitting a signal, the RFIC 352 may up-convert an IF signal (e.g., approximately 9 GHz to approximately 11 GHz) obtained from an intermediate frequency integrated circuit (IFIC) (e.g., 228 of FIG. 2) into an RF signal. In the case of receiving a signal, the RFIC 352 may down-convert an RF signal obtained through the antenna array 330 into an IF signal and may provide the IF signal to the IFIC.

The PMIC 354 may be disposed in another region (e.g., on the second surface) of the printed circuit board 310, which is spaced from the antenna array. The PMIC may be supplied with a voltage from a main PCB (not illustrated) and may provide a power necessary for various components (e.g., the RFIC 352) on the antenna module.

The shielding member 390 may be disposed at a portion (e.g., on the second surface) of the printed circuit board 310 such that at least one of the RFIC 352 or the PMIC 354 is electromagnetically shielded. According to an embodiment, the shielding member 390 may include a shield can.

Although not illustrated, in various embodiments, the third antenna module 246 may be electrically connected with another printed circuit board (e.g., a main circuit board) through the module interface. The module interface may include a connection member, for example, a coaxial cable connector, a board to board connector, an interposer, or a flexible printed circuit board (FPCB). The RFIC 352 and/or the PMIC 354 of the antenna module may be electrically connected with the printed circuit board 310 through the connection member.

Figure 4:
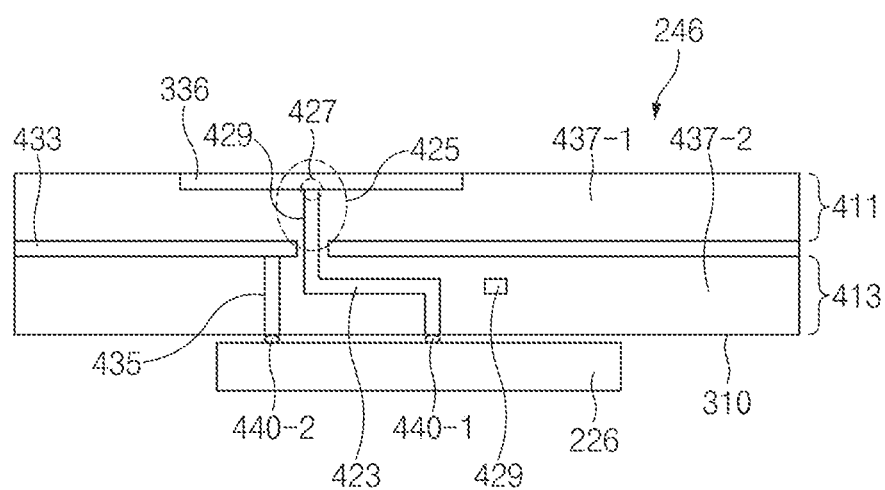
FIG. 4 illustrates a cross-sectional view of a third antenna module taken along a line B-B' of FIG. 3.

FIG. 4 illustrates a cross-sectional view of the third antenna module 246 taken along line B-B' of FIG. 3. The printed circuit board 310 of the illustrated embodiment may include an antenna layer 411 and a network layer 413.

The antenna layer 411 may include at least one dielectric layer 437-1, and the antenna element 336 and/or a feeding part 425 formed on an outer surface of the dielectric layer 437-1 or therein. The feeding part 425 may include a feeding point 427 and/or a feeding line 429.

The network layer 413 may include at least one dielectric layer 437-2 and at least one ground layer 433, at least one conductive via 435, a transmission line 423, and/or a signal line 429 formed on an outer surface of the dielectric layer 437-2 or therein.

In addition, in the illustrated embodiment, the third RFIC 226 of FIG. 2 may be electrically connected with the network layer 413, for example, through first and second connection parts (e.g., solder bumps) 440-1 and 440-2. In other embodiments, various connection structures (e.g., soldering or a BGA) may be utilized instead of the connection part. The third RFIC 226 may be electrically connected with the antenna element 336 through the first connection part 440-1, the transmission line 423, and the feeding part 425. Also, the third RFIC 226 may be electrically connected with the ground layer 433 through the second connection part 440-2 and the conductive via 435. Although not illustrated, the third RFIC 226 may also be electrically connected with the above module interface through the signal line 429.

Figure 5A:
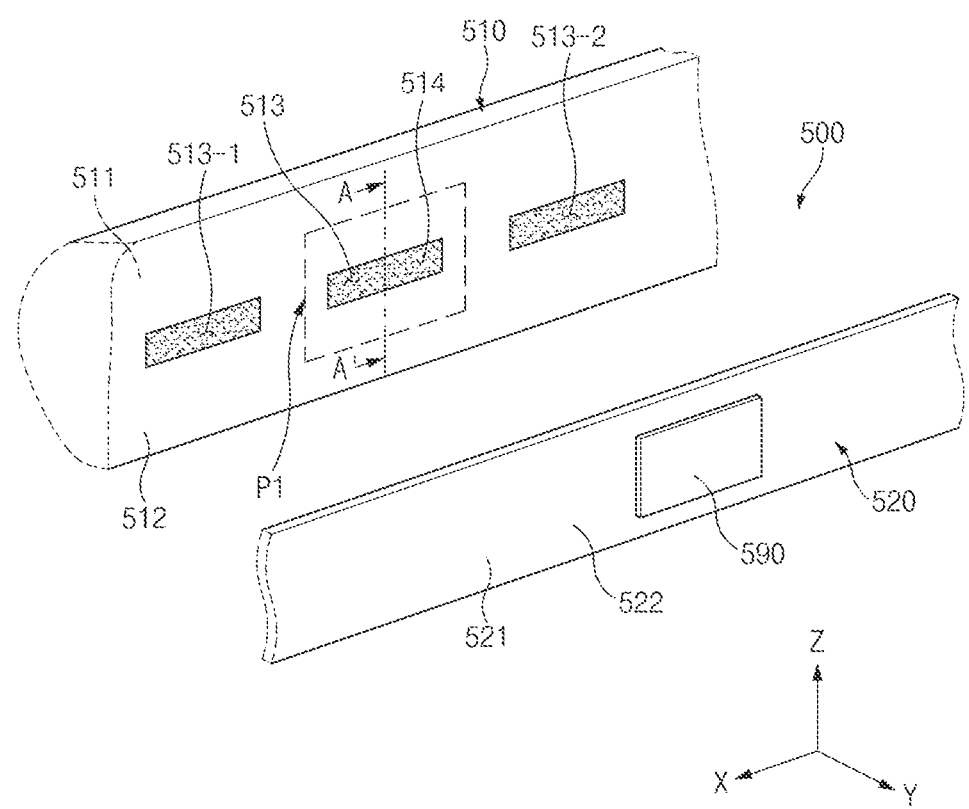
FIG. 5A is a diagram illustrating a separated state of an antenna module according to an embodiment.
Figure 5B:
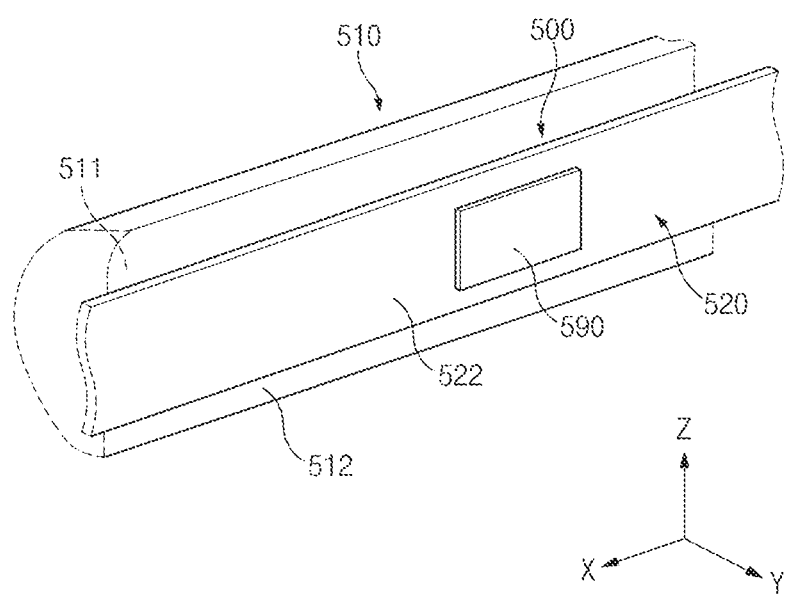
FIG. 5B is a diagram illustrating a coupled state of an antenna module according to an embodiment.

FIG. 5A is a diagram illustrating a separated state of an antenna module according to an embodiment. FIG. 5B is a diagram illustrating a coupled state of an antenna module according to an embodiment. An antenna module 500 of FIGS. 5A and 5B may be at least partially similar to the third antenna module 246 of FIG. 2 or may further include any other embodiments.

Referring to FIGS. 5A and 5B, an electronic device (e.g., the electronic device 101 of FIG. 1) may include a side member 510, at least a portion of which is formed of a conductive material, and the antenna module 500 disposed to face the side member in an inner space of the electronic device 101. The side member 510 may include a first surface 511 facing the outside of a housing (e.g., the outside of the electronic device 101) and a second surface 512 facing away from the first surface 511 (or facing the inner space of the electronic device 101). The side member may include a plurality of through holes 513, 513-1, and 513-2 that are formed to extend from the first surface 511 to the second surface 512 and are disposed at regular intervals. The case where three through holes 513, 513-1, and 513-2 are arranged is illustrated in FIG. 5A. However, the disclosure is not limited thereto. For example, the plurality of through holes 513, 513-1, and 513-2 may include two or four or more through holes.

Below, one through hole 513 disposed at a first portion P1 of the side member 510 will be described for convenience. However, the disclosure is not limited thereto. The remaining through holes 513-1 and 513-2 and a feeding structure of the antenna module 500 corresponding thereto may also have substantially the same configuration.

In an embodiment, the through hole 513 may be formed in a first direction (i.e., a Y-axis direction) being a direction penetrating the side member 510 from the first surface 511 to the second surface 512. The through hole 513 may be filled with a first non-conductive material 514. For example, the first non-conductive material 514 may include a dielectric (e.g., polycarbonate (PC)) that is formed by filling and solidifying a liquid or semi-solid material in the through hole 513. The through hole 513 that is exposed to the outside of the side member 510 may be processed so as not to be viewable with the naked eye, through an opaque varnish after the first non-conductive material 514 is filled therein.

In an embodiment, the antenna module 500 may be disposed in the inner space of the electronic device 101. For example, the antenna module 500 may be disposed such that a beam pattern is formed toward a side surface of the electronic device 101. For another example, the antenna module 500 may be disposed such that a beam pattern is formed to face at least a portion of a back plate or a front plate of the electronic device 101.

In an embodiment, the antenna module 500 may include a printed circuit board 520 disposed in the inner space of the electronic device 101 and a wireless communication circuit 590 disposed on the printed circuit board 520. The antenna module 500 may be disposed to face the first portion P1 having a wireless signal waveguide structure through the through hole 513 of the side member 510 including a conductive material.

In an embodiment, the printed circuit board 520 may include a third surface 521 facing the second surface 512 and a fourth surface 522 facing away from the third surface 521. In the case where the printed circuit board 520 is disposed on the side member 510, the second surface 512 and the third surface 521 may be disposed to face each other.

In an embodiment, the wireless communication circuit 590 may be disposed on the fourth surface 522 of the printed circuit board 520 as illustrated in FIGS. 5A and 5B. However, the disclosure is not limited thereto. For example, the wireless communication circuit 590 may be disposed within the electronic device 101, not on a printed circuit board, and may be electrically connected with the printed circuit board 520 through a conductive cable (e.g., a flexible printed circuit board (FPCB)). The wireless communication circuit 590 may be configured to transmit and/or receive a signal whose frequency is approximately 3 GHz or more and approximately 100 GHz or less, through the antenna module 500 and the through hole 513.

In an embodiment, the printed circuit board 520 may include a slit (e.g., a slit 5231 of FIG. 7A) that is disposed on the third surface 521 and faces the through hole 513. The electronic device 101 may have a coupling structure that allows the slit of the printed circuit board 520 and the through hole 513 of the side member 510 to face each other. For example, the printed circuit board 520 may include a plurality of slits that respectively face the plurality of through holes 513, 513-1, and 513-2 at positions respectively corresponding to the plurality of through holes 513, 513-1, and 513-2 formed in the side member 510. For another example, the electronic device may include at least two printed circuit boards having at least one slit corresponding to each of the plurality of through holes 513, 513-1, and 513-2 formed in the side member 510.

In an embodiment, a recess that is stepped so as to be lower than the second surface 512 may be formed in an area that belongs to the second surface 512 of the side member 510 and includes the through hole 513. Through an operation in which the printed circuit board 520 is seated in the recess, the slit and the through hole 513 may be guided to face each other.

In an embodiment, in the case where a feeding structure is disposed on a structure (e.g., a dielectric structure) instead of the printed circuit board 520, a protrusion may be formed at at least one member of the structure and the side member 510, and a recess may be formed at a counterpart member corresponding thereto. Through an operation in which the protrusion of the at least one member of the structure and the side member 510 is inserted into the recess of the counterpart member, the slit and the through hole 513 may be guided to face each other.

Figure 6:
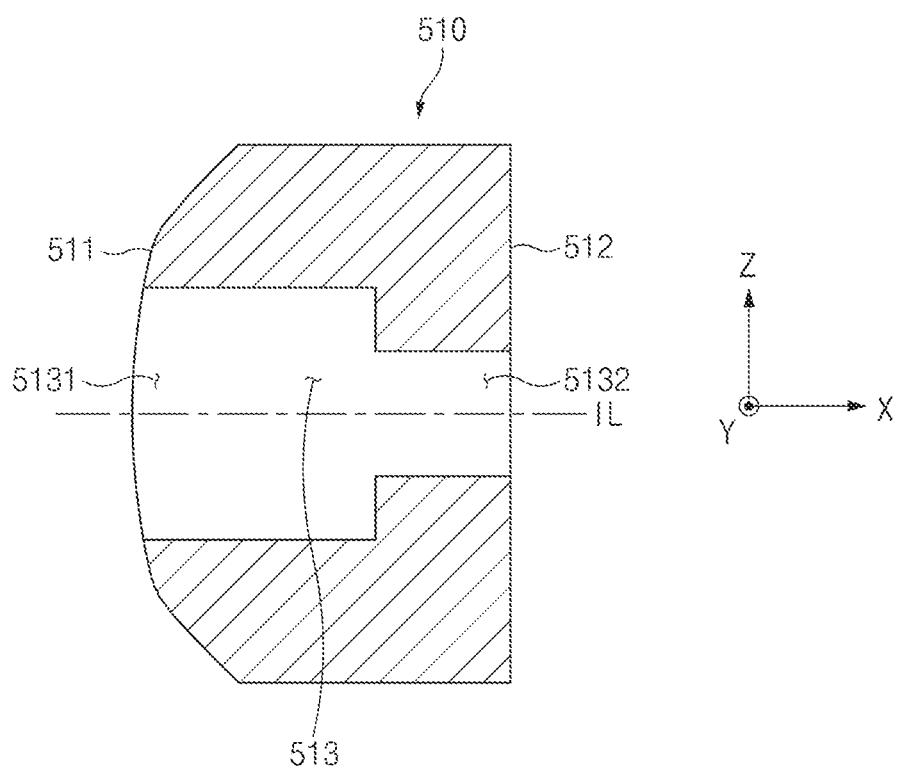
FIG. 6 is a cross-sectional view illustrating a shape of a through hole of a side member according to an embodiment, when viewed from line A-A' of FIG. 5A.

FIG. 6 is a cross-sectional view illustrating a shape of the through hole 513 of the side member 510 according to an embodiment, when viewed from line A-A' of FIG. 5A.

Referring to FIG. 6, the side member 510 may include the through hole 513 that is formed in the first direction (i.e., the Y-axis direction) being the direction penetrating the side member 510 from the first surface 511 to the second surface 512. The through hole 513 may include a first opening 5131 that is close to the first surface 511 and has a first size, and a second opening 5132 that extends from the first opening 5131, is close to the second surface 512, and has a second size smaller than the first size. For example, the through hole 513 may be formed to be stepped at a boundary of the first opening 5131 and the second opening 5132. For another example, the through hole 513 may be formed to be symmetrical with respect to an imaginary center line IL. However, the disclosure is not limited thereto. For example, the through hole 513 may have various shapes in which the cross-sectional area thereof decreases or is maintained uniformly while extending from the first opening 5131 to the second opening 5132 within the side member 510.

Figure 7A:
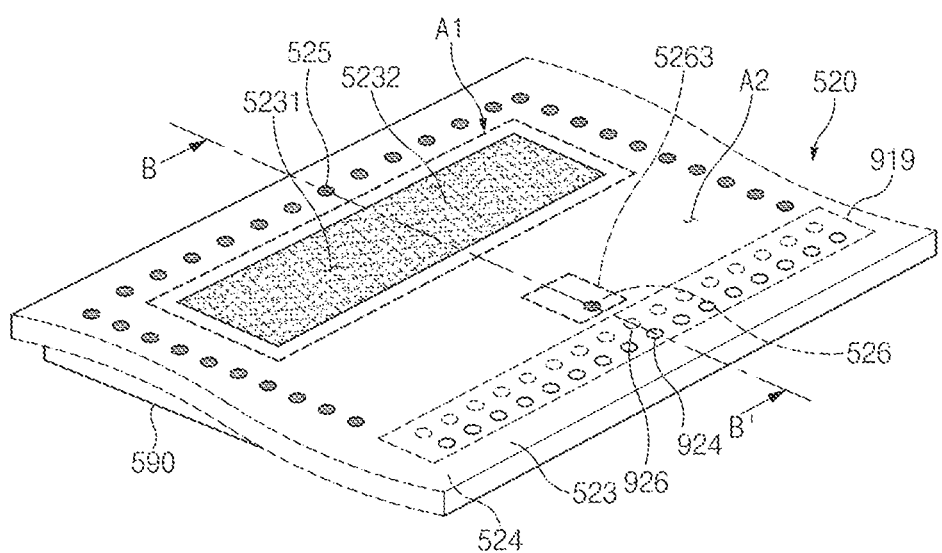
FIG. 7A is a perspective view of a printed circuit board according to an embodiment.
Figure 7B:
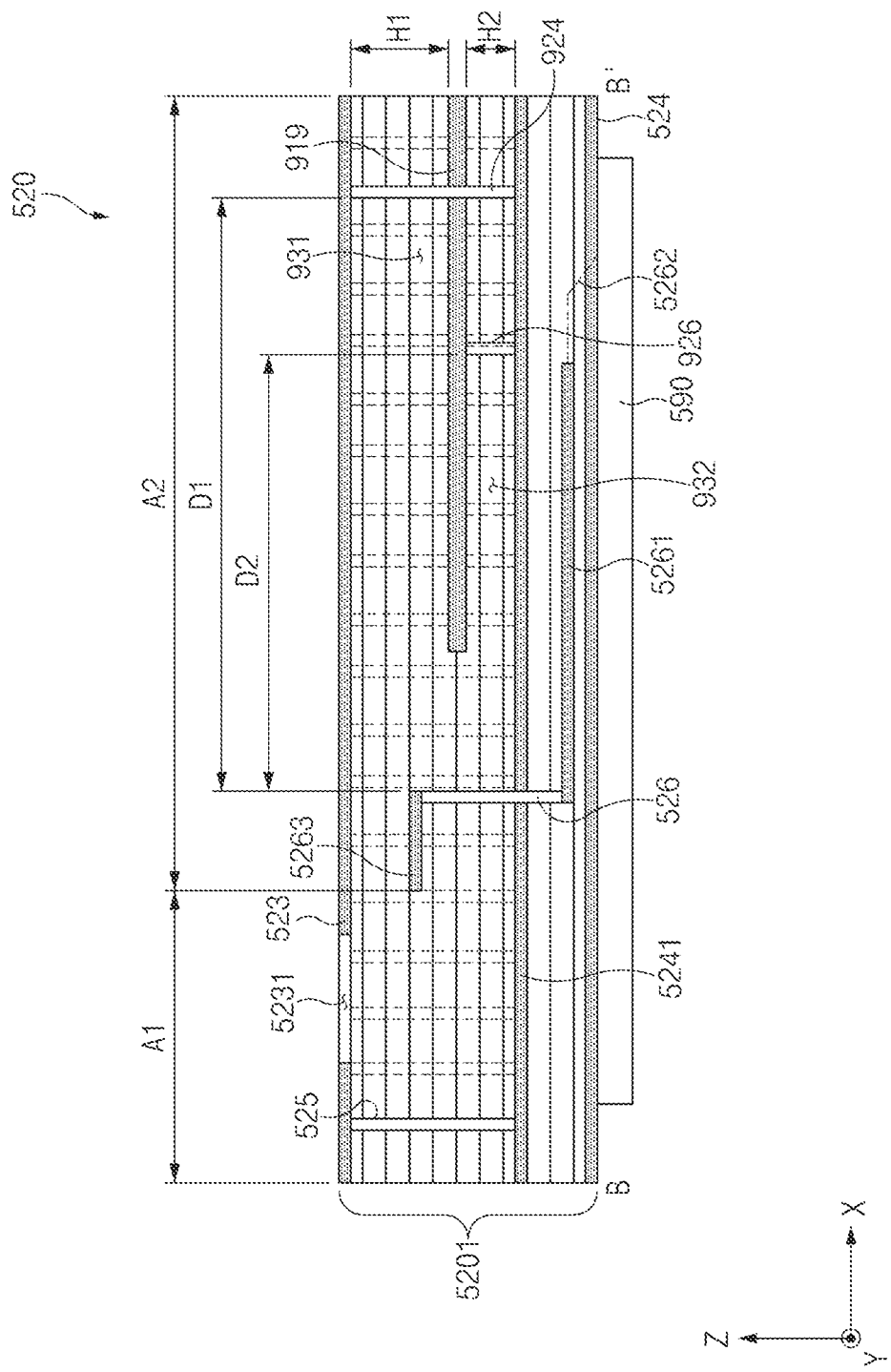
FIG. 7B is a cross-sectional view of a printed circuit board according to an embodiment, when viewed from line B-B' of FIG. 7A.

FIG. 7A is a perspective view of the printed circuit board 520 according to various embodiments of the disclosure. FIG. 7B is a cross-sectional view illustrating a stacked structure of the printed circuit board 520 according to various embodiments of the disclosure, when viewed from line B-B' of FIG. 7A.

In an embodiment, the printed circuit board 520 may include a first conductive layer 523 facing the second surface 512 of the side member 510 and a second conductive layer 524 facing away from the first conductive layer 523. The printed circuit board 520 may include a first area A1 and a second area A2 on the first conductive layer 523, and the second area A2 may be disposed around the first area A1.

In an embodiment, the first area A1 may include the slit 5231 that at least partially overlaps the second opening 5132 when viewed from above the first surface 511 of the side member 510. The slit 5231 may be formed by an omitted (or removed) portion of the first conductive layer 523. The slit 5231 of the first area A1 may include a second non-conductive material 5232. The second non-conductive material 5232 may include an insulating layer.

In an embodiment, the second area A2 may include a plurality of conductive vias 525 that are arranged around the first area A1. The plurality of conductive vias 525 may be arranged at regular intervals so as to form the second area A2. The plurality of conductive vias 525 may electrically connect the first conductive layer 523 and the second conductive layer 524 through an insulating layer of the printed circuit board 520. For example, the second area A2 may include a substrate integrated waveguide (SIW) structure formed through the plurality of conductive vias 525.

In an embodiment, the printed circuit board 520 may further include a conductive pattern 5263 of a given size, which is interposed between the first conductive layer 523 and the second conductive layer 524 of the second area A2. The conductive pattern 5263 may be positioned so as to be capacitively coupled with the first conductive layer 523.

In the embodiment, the second conductive layer 524 and the conductive pattern 5263 may be connected through a conductive via 526. The conductive via 526 may feed the conductive pattern 5263 such that the first conductive layer 523 capacitively coupled with the conductive pattern 5263 is indirectly fed.

In an embodiment, as illustrated in FIG. 7B, a third conductive layer 5241 (e.g., a third conductive layer 917 of FIG. 9) and a fourth conductive layer 919 may be disposed within the printed circuit board 520. The third conductive layer 5241 and the fourth conductive layer 919 may be interposed between the second conductive layer 524 and the first conductive layer 523. The third conductive layer 5241 may be disposed in the first area A1 and the second area A2. The fourth conductive layer 919 may be spaced from the first area A1 and may be disposed in the second area A2. A wall that is formed of a plurality of first side vias 924 may be defined between the first conductive layer 523 and the third conductive layer 5241. A wall that is formed of a plurality of second side vias 926 may be defined between the third conductive layer 5241 and the fourth conductive layer 919.

In an embodiment, the plurality of conductive vias 525 may have a wireless signal waveguide structure surrounding the first area A1 in the shape of a closed loop, when viewed from above the first conductive layer 523. The plurality of conductive vias 525 may include the SIW structure surrounding the first area A1 and the conductive via 526. The antenna module 500 may be connected with a waveguide structure by the through hole 513, which has a channel formed between the first opening 5131 and the second opening 5132. The antenna module 500 may transmit and/or receive a wireless signal through a horn structure for waveguide.

In an embodiment, the printed circuit board 520 may have a layer structure 5201 in which a plurality of insulating layers and the first to fourth conductive layers 523, 524, 5241, and 919 are alternately stacked. The printed circuit board 520 may be configured to separate the first to fourth conductive layers 523, 524, 5241, and 919 from each other by using the plurality of insulating layers.

In an embodiment, the first and second conductive layers 523 and 524 may be disposed to be exposed on at least a portion of a surface of the printed circuit board 520. The third and fourth conductive layers 5241 and 919 may be disposed between the plurality of insulting layers within the printed circuit board 520.

In an embodiment, a feeding line 5261 may be formed between the second and third conductive layers 524 and 5241. The feeding line 5261 may be electrically connected with the conductive pattern 5263 through the conductive via 526. The feeding line 5261 may be electrically connected with the wireless communication circuit 590 through a connection part 5262. The feeding line 5261 may be provided with a signal from the wireless communication circuit 590 so as to be transferred to the conductive via 526. The first conductive layer 523 may be indirectly supplied with the signal from the conductive pattern 5263.

In an embodiment, the conductive via 526 may feed the conductive pattern 5263. The conductive pattern 5263 may be capacitively coupled with the first conductive layer 523. The first conductive layer 523 may be indirectly supplied with the signal transferred to the conductive pattern 5263 by using the conductive via 526. The signal thus fed may be transmitted by using the slit 5231 included in the first conductive layer 523. For example, as the slit 5231 included in the first conductive layer 523 is disposed on a side surface of the printed circuit board 520 and the side surface of the printed circuit board 520 and one surface of a radiator (e.g., the second surface 512 of the side member 510 of FIG. 5A) transmitting and/or receive a signal are horizontally coupled by face-to-face bonding, an antenna module (e.g., the antenna module 500 of FIG. 5A) that horizontally feeds a signal may be implemented.

In an embodiment, the first conductive layer 523, the second conductive layer 524, the third conductive layer 5241, and the fourth conductive layer 919 may implement a transition structure of a transmission line. The first conductive layer 523, the second conductive layer 524, the third conductive layer 5241, and the fourth conductive layer 919 may implement a circuitally opened structure such that most of the fed signal is radiated substantially through the slit 5231 without propagation into the printed circuit board 520.

In an embodiment, the first conductive layer 523, the second conductive layer 524, the third conductive layer 5241, and the fourth conductive layer 919 may implement a plurality of shorting stubs 931 and 932. The plurality of shorting stubs 931 and 932 may implement the circuitally opened structures with respect to signals in different frequency bands. The plurality of shorting stubs 931 and 932 may include the first shorting stub 931 and the second shorting stub 932.

In an embodiment, electrical lengths of the first and second shorting stubs 931 and 932 may be determined by the plurality of side vias 924 and 926. The plurality of shorting stubs 931 and 932 may have different physical lengths. The plurality of shorting stubs 931 and 932 may implement the circuitally opened structures by the plurality of first and second side vias 924 and 926. The first and second side vias 924 and 926 may include the first side vias 924 and the second side vias 926.

In an embodiment, the first side vias 924 may be formed between the first conductive layer 523 and the third conductive layer 5241. The first side vias 924 may electrically connect the first conductive layer 523 and the third conductive layer 5241. The first side vias 924 may be spaced from the conductive via 526 in a second direction (i.e., an X-axis direction) being a direction that is perpendicular to the first direction (i.e., the Y-axis direction) and faces away from a through hole (e.g., the through hole 513 of FIG. 5A) and the slit 5231. The first side vias 924 may be spaced from the conductive via 526 in the second direction (i.e., the X-axis direction) as much as a first length D1. The first side vias 924 may form the wall between the first conductive layer 523 and the third conductive layer 5241. The first side vias 924 may set the length of the first shorting stub 931.

In an embodiment, the second side vias 926 may be formed between the third conductive layer 5241 and the fourth conductive layer 919. The second side vias 926 may electrically connect the third conductive layer 5241 and the fourth conductive layer 919. The second side vias 926 may be spaced from the conductive via 526 in the second direction (i.e., the X-axis direction). The second side vias 926 may be spaced from the conductive via 526 as much as a second length D2. The second side vias 926 may form the wall between the third conductive layer 5241 and the fourth conductive layer 919. The second side vias 926 may set the length of the second shorting stub 932.

Figure 8:
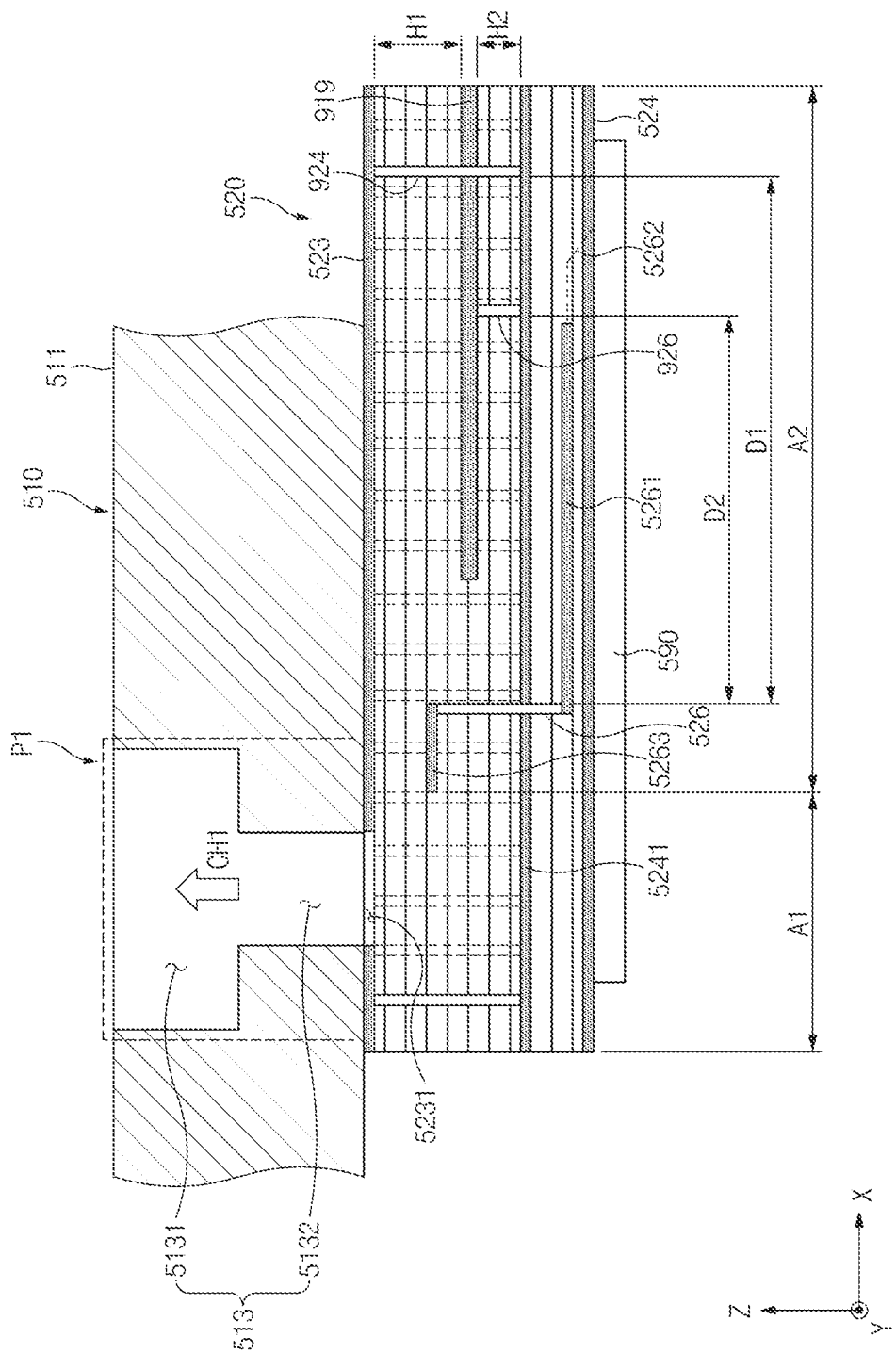
FIG. 8 is a cross-sectional view illustrating an antenna structure in which a printed circuit board and an antenna module are coupled, according to an embodiment.

FIG. 8 is a cross-sectional view illustrating a coupled state of the antenna module 500 according to various embodiments.

Referring to FIG. 8, the printed circuit board 520 may be disposed on the side member 510. The second surface 512 of the side member 510 and the third surface 521 of the printed circuit board 520 may be disposed in a face-to-face contact manner. The second opening 5132 of the through hole 513 of the side member 510 and the slit 5231 of the printed circuit board 520 may face each other. The slit 5231 may have substantially the same size and/or shape as the second opening 5132. The wireless communication circuit 590 may feed a signal to the conductive pattern 5263 through the conductive via 526. The wireless communication circuit 590 may transmit and/or receive a signal whose frequency is approximately 3 GHz or more and approximately 100 GHz or less, through the slit 5231 and the through hole 513 forming a radiator structure of a horn shape.

Figure 9:
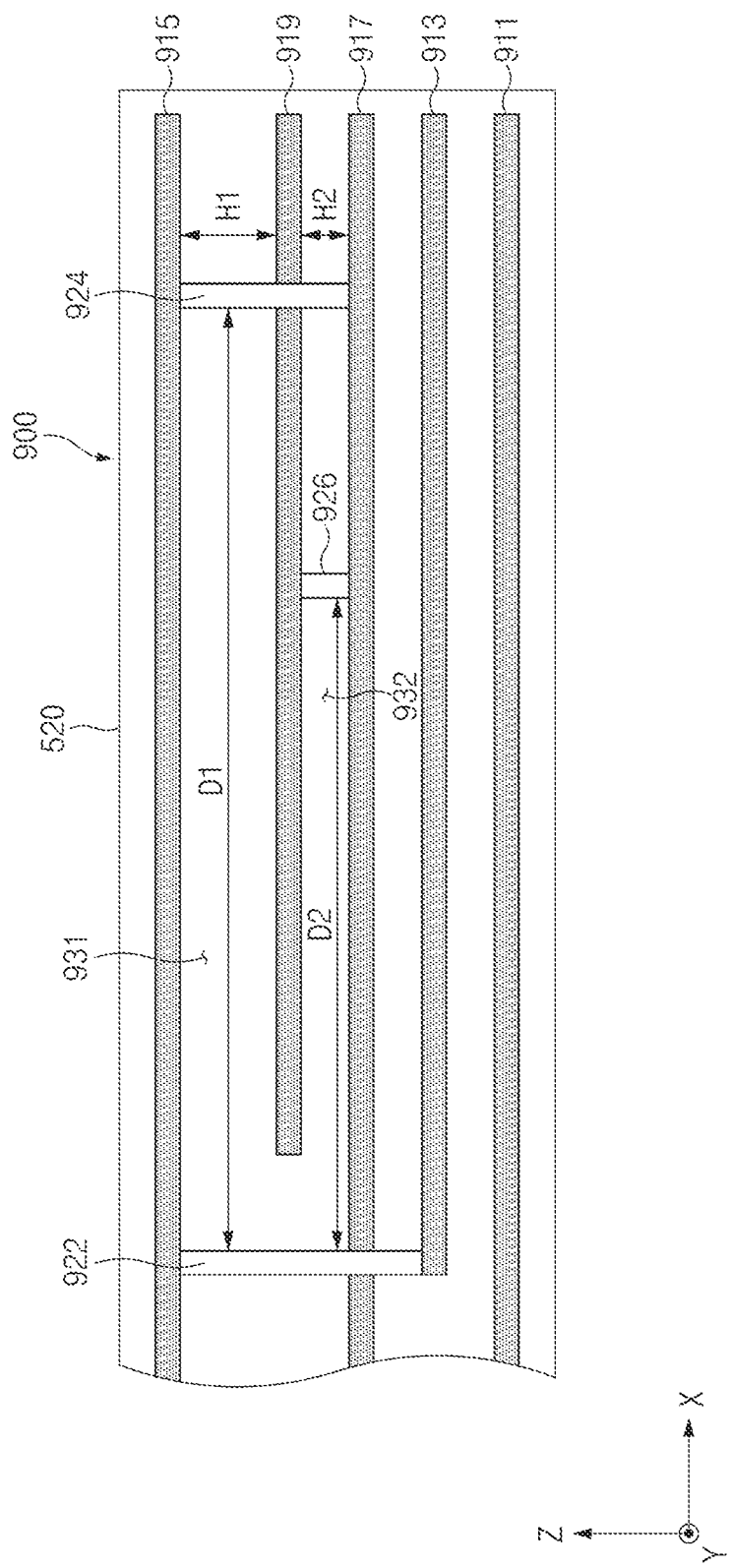
FIG. 9 is a cross-sectional view of a printed circuit board according to an embodiment.

FIG. 9 is a cross-sectional view 900 of the printed circuit board 520 according to an embodiment. The printed circuit board 520 may include a plurality of conductive layers 911, 913, 915, 917, and 919 and/or a plurality of via structures 922, 924, and 926. The first shorting stub 931 and the second shorting stub 932 may be provided within the printed circuit board 520.

In an embodiment, the plurality of conductive layers 911, 913, 915, 917, and 919 may include the ground layer 911 (e.g., the second conductive layer 524 of FIG. 7B), the feeding line 913 (e.g., the feeding line 5261 of FIG. 7B), the first conductive layer 915, the third conductive layer 917 (e.g., the third conductive layer 5241 of FIG. 7B), and/or the fourth conductive layer 919. The plurality of via structures 922, 924, and 926 may include the first conductive via 922, the first side via 924, and/or the second side via 926.

In the embodiment, the ground layer 911 may set a ground voltage or a reference voltage of a printed circuit board. The ground layer 911 may be supplied with the ground voltage or the reference voltage from the wireless communication circuit 590.

In an embodiment, the feeding line 913 may be connected with a wireless communication circuit (e.g., the wireless communication circuit 590 of FIG. 7B). The feeding line 913 may be fed by the wireless communication circuit 590. The feeding line 913 may be connected with the first conductive layer 915 through the first conductive via 922.

In an embodiment, the first conductive layer 915 may be fed through the first conductive via 922. An electric field may be formed between the first conductive layer 915 and the third conductive layer 917. The first conductive layer 915, the third conductive layer 917, and the fourth conductive layer 919 may form a transmission line and may simultaneously form the first shorting stub 931 and the second shorting stub 932 for a signal transition. A transition of signals belonging to a specified frequency from among signals generated by an electric field between the first conductive layer 915 and the third conductive layer 917 may be made by using the first shorting stub 931 and the second shorting stub 932. For example, the first shorting stub 931 may transition a signal in a first frequency band, and the second shorting stub 932 may transition a signal in a second frequency band different from the first frequency band.

In an embodiment, the first shorting stub 931 may have the first length D1. The second shorting stub 932 may have the second length D2. The first length D1 may be a length that allows the first shorting stub 931 to operate substantially as an open circuit in the first frequency band. The second length D2 may be a length that allows the second shorting stub 932 to operate substantially as an open circuit in the second frequency band. For example, the first length D1 may be a quarter wave length of a signal belonging to the first frequency band, and the second length D2 may be a quarter wave length of a signal belonging to the second frequency band. In the case where the first length D1 is longer than the second length D2, the first frequency band may be a frequency band to which a signal whose wavelength is longer than that in the second frequency band belongs. For example, in the case where a center frequency of the first frequency band is approximately 28 CN, the first length D1 may be approximately 2 mm or more and approximately 2.5 mm or less in consideration of the permittivity of the printed circuit board 520. For another example, in the case where the center frequency of the first frequency band is approximately 39 M, the second length D2 may be approximately 0.8 mm or more and approximately 1.4 mm or less in consideration of the permittivity of the printed circuit board 520.

In an embodiment, lengths of the first shorting stub 931 and the second shorting stub 932 may be determined by the first side via 924 and the second side via 926, respectively. Positions of the first side via 924 and the second side via 926 may be set such that lengths of the first shorting stub 931 and the second shorting stub 932 are substantially the same as lengths of the open circuits at signals in the corresponding frequency bands.

In an embodiment, the first shorting stub 931 and the second shorting stub 932 may transition signals in both the first frequency band and the second frequency band. The signals in the first frequency band and the second frequency band may be prevented from being distributed into the printed circuit board 520 by using the first shorting stub 931 and the second shorting stub 932. In this case, all the signals in the first frequency band and the second frequency band may be substantially transferred to an antenna radiator (e.g., the through hole 513 of FIG. 5A), and thus, the radiation efficiency of the antenna radiator 513 may be improved in both the first frequency band and the second frequency band.

In an embodiment, the first shorting stub 931 may have a first height H1. The second shorting stub 932 may have a second height H2. A bandwidth of a signal experiencing a transition at the first shorting stub 931 and/or the second shorting stub 932 may be set by adjusting the first height H1 and/or the second height H2. As the height of the first shorting stub 931 and/or the second shorting stub 932 increases, the quality factor of a resonator may decrease, and a bandwidth may increase. In the case of requiring a transition of signals belonging to the corresponding frequency band at the first shorting stub 931 and/or the second shorting stub 932, the height of the first shorting stub 931 and/or the second shorting stub 932 may increase. For example, a transition of signals belonging to the first frequency band may be made by increasing the first height H1, and a transition of signals belonging to the second frequency band may be made by increasing the second height H2.

In an embodiment, the first conductive via 922 may perform a role of a feeding part. The first conductive layer 915 may be directly fed by using the first conductive via 922 as illustrated in FIG. 9. For another example, a conductive via (e.g., the conductive via 526 of FIG. 8) may be connected with a conductive pattern (e.g., the conductive pattern 5263 of FIG. 8) such that the first conductive layer 915 is indirectly fed.

In an embodiment, a slit (e.g., the slit 5231 of FIG. 7B) may be disposed in the first conductive layer 915, or may be disposed on a side surface of a printed circuit board (e.g., the printed circuit board 700 of FIG. 7B). For example, as illustrated in FIG. 18B, in the case of a horizontal mounting structure in which the printed circuit board 700 is horizontally coupled to a side member (e.g., a side member 1810 of FIG. 18B) of the electronic device 101, a slit may be disposed on a side surface thereof.

Figure 10:
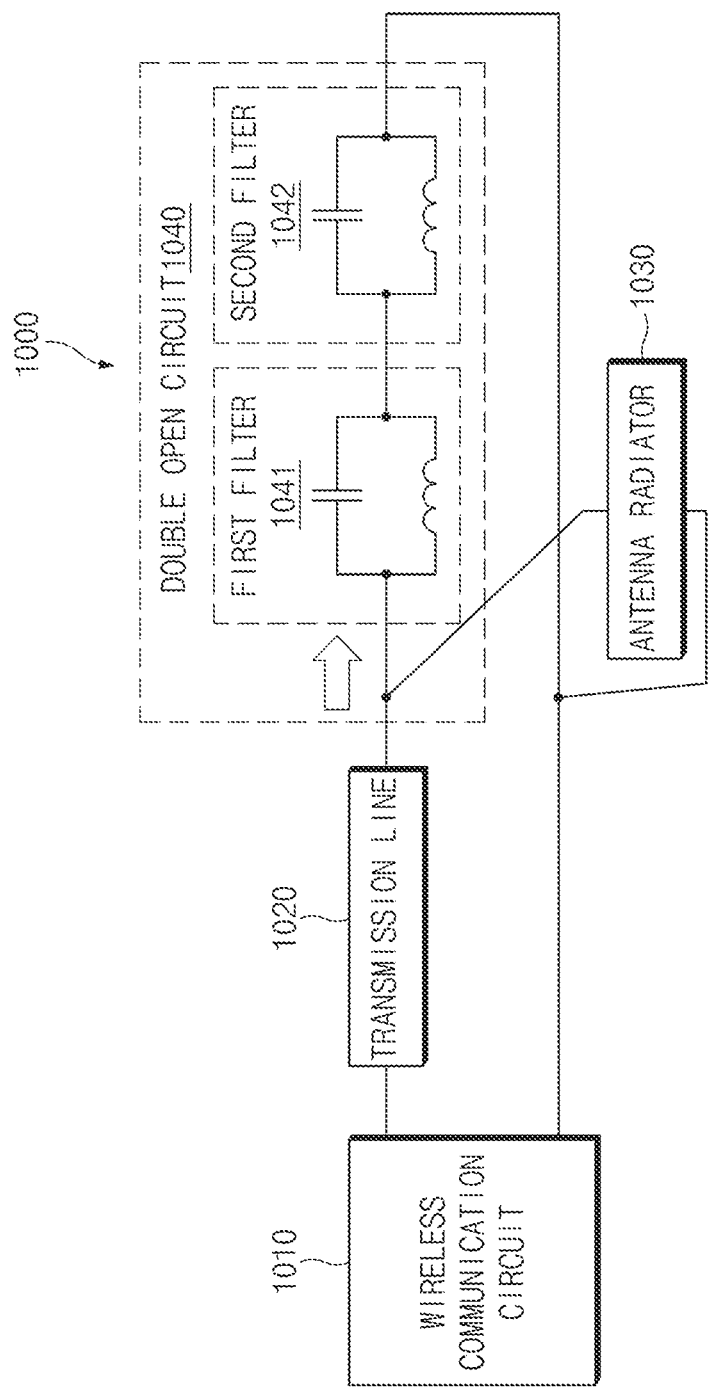
FIG. 10 is a diagram illustrating a wireless communication circuit, a transmission line, an antenna radiator, and/or a double open circuit of an antenna structure according to an embodiment.

FIG. 10 is a diagram 1000 illustrating a wireless communication circuit 1010, a transmission line 1020, an antenna radiator 1030, and/or a double open circuit 1040 of an antenna structure according to an embodiment.

In an embodiment, the wireless communication circuit 1010 may feed a signal to the antenna radiator 1030 by using the transmission line 1020. The transmission line 1020 may transfer a signal to the antenna radiator 1030. When the transmission line 1020 is abnormal, a loss of a signal to a branch path connected with the antenna radiator 1030 may occur.

In an embodiment, the double open circuit 1040 may be connected with the transmission line 1020 and the antenna radiator 1030. The double open circuit 1040 may be disposed on a path branched between the transmission line 1020 and the antenna radiator 1030. The double open circuit 1040 may operate as an open circuit in two frequency bands. The double open circuit 1040 may include a first filter 1041 and a second filter 1042.

In an embodiment, the first filter 1041 and the second filter 1042 may be connected in series. Each of the first filter 1041 and the second filter 1042 may be formed by connecting an inductance element and/or a capacitance element in parallel. A structure in which a plurality of shorting stubs (e.g., the first shorting stub 931 and the second shorting stub 932) having different lengths are vertically disposed may be substantially the same as a structure in which two filters are connected in series. Accordingly, FIG. 10 may correspond to an equivalent circuit circuitally indicating a printed circuit board structure of FIG. 9.

In an embodiment, each of the first filter 1041 and the second filter 1042 may be a band-stop filter (BSF). Each of the first filter 1041 and the second filter 1042 may be substantially the same as an open circuit with regard to a signal in a frequency band corresponding to a stopband thereof. The first filter 1041 may operate as an open circuit with regard to a signal in the first frequency band. The second filter 1042 may operate as an open circuit with regard to a signal in the second frequency band.

In an embodiment, an open circuit associated with a signal in a specified frequency band may prevent a signal and/or energy of a specified frequency from being transferred. As such, the double open circuit 1040 may prevent a signal in the first frequency band and a signal in the second frequency band from being transferred in an arrow direction of FIG. 10. Most of the signal in the first frequency band and the signal in the second frequency band transferred through the transmission line 1020 may be transferred to the antenna radiator 1030 substantially.

In an embodiment, a signal in the first frequency band and energy of the second frequency band may be transferred to a horn antenna (e.g., the antenna radiator 1030) without a transfer to a shorting stub (e.g., the first shorting stub 931 and the second shorting stub 932 of FIG. 9). Even though only at least one of the first filter 1041 or the second filter 1042 resonates in a state where the first filter 1041 and the second filter 1042 are connected in series, a signal fed from the wireless communication circuit 1010 may be transferred to the antenna radiator 1030. As such, signals belonging to the first frequency band and the second frequency band may be transferred to the antenna radiator 1030, and thus, the performance of radiation may be improved.

Figure 11:
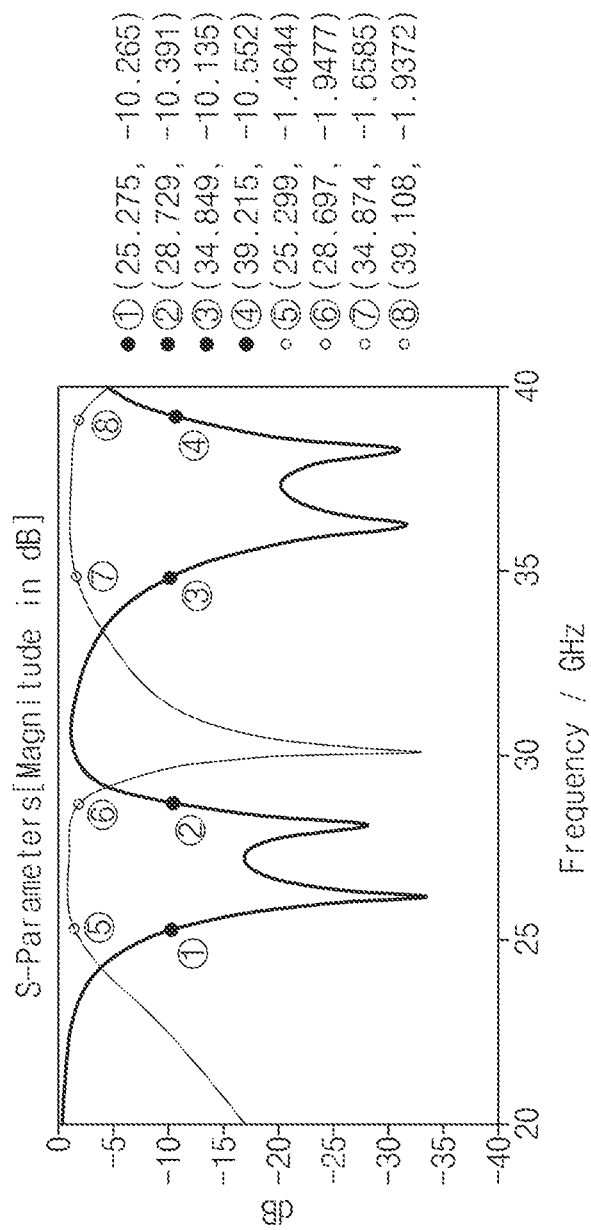
FIG. 11 is a graph illustrating a transfer characteristic of an antenna structure according to an embodiment.

FIG. 11 is a graph illustrating a transfer characteristic of an antenna structure according to an embodiment.

In an embodiment, a transfer characteristic of an antenna structure including a double open circuit (e.g., the double open circuit 1040 of FIG. 10) may be expressed by S-parameters. The S-parameter may indicate matching between a port of a wireless communication circuit (e.g., the wireless communication circuit 590 of FIG. 7B) and an antenna structure. A first filter (e.g., the first filter 1041 of FIG. 10) and a second filter (e.g., the second filter 1042 of FIG. 10) may respectively have band pass characteristics in different frequency bands by adjusting resonant frequencies thereof. For example, from a plurality of measuring points 1 to 8 of FIG. 10, the antenna structure may have a characteristic of passing a frequency band of approximately 26 GHz or more and approximately 28 GHz or less or a band of approximately 35 GHz or more and approximately 39 M or less, which is a frequency band used in 5G communication.

In an embodiment, a transfer characteristic of an antenna structure including the double open circuit 1040 may be confirmed through S-parameters at the plurality of measuring points 1 to 8. As a result of analyzing S-parameters of some measuring points 2, 3, 6, and 7, it may be confirmed that a high insertion loss occurs at a frequency of approximately 28 GHz or more and approximately 35 M or less being a frequency band that is not used. A notch filter that blocks a signal in an unnecessary frequency band may be implemented by applying the double open circuit 1040.

Figure 12:
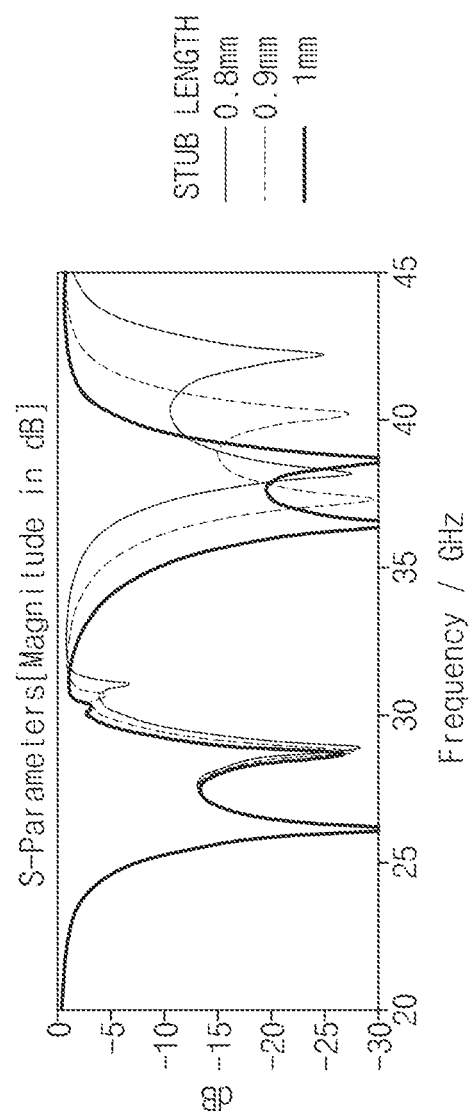
FIG. 12 is a graph illustrating a pass frequency band according to a stub length of an antenna structure according to an embodiment.

FIG. 12 is a graph illustrating a pass frequency band according to a stub length of an antenna structure according to an embodiment.

In an embodiment, an antenna structure may include a plurality of shorting stubs (e.g., the first shorting stub 931 and the second shorting stub 932 of FIG. 9). The plurality of shorting stubs may implement a resonant circuit having a resonant frequency. The plurality of shorting stubs may operate as an open circuit at a resonant frequency.

In an embodiment, a resonant frequency may be controlled by adjusting a length of each of the plurality shorting stubs. FIG. 12 shows an example in which a length of a stub corresponding to a low frequency band is maintained and a length of a stub corresponding to a high frequency band is changed. As such, a resonant frequency band associated with a low frequency may be maintained, and a resonant frequency band associated with a high frequency may change. For example, in the case where a stub length is approximately 0.8 mm, a resonant frequency band associated with a high frequency may be approximately 38 GHz or more and approximately 42 GHz or less. In the case where the stub length is adjusted to approximately 0.9 mm, the resonant frequency band associated with the high frequency may be approximately 37 GHz or more and approximately 41 GHz or less. In the case where the stub length is adjusted to approximately 1 mm, the resonant frequency band associated with the high frequency may be approximately 35 GHz or more and approximately 39 GHz or less.

Figure 13:
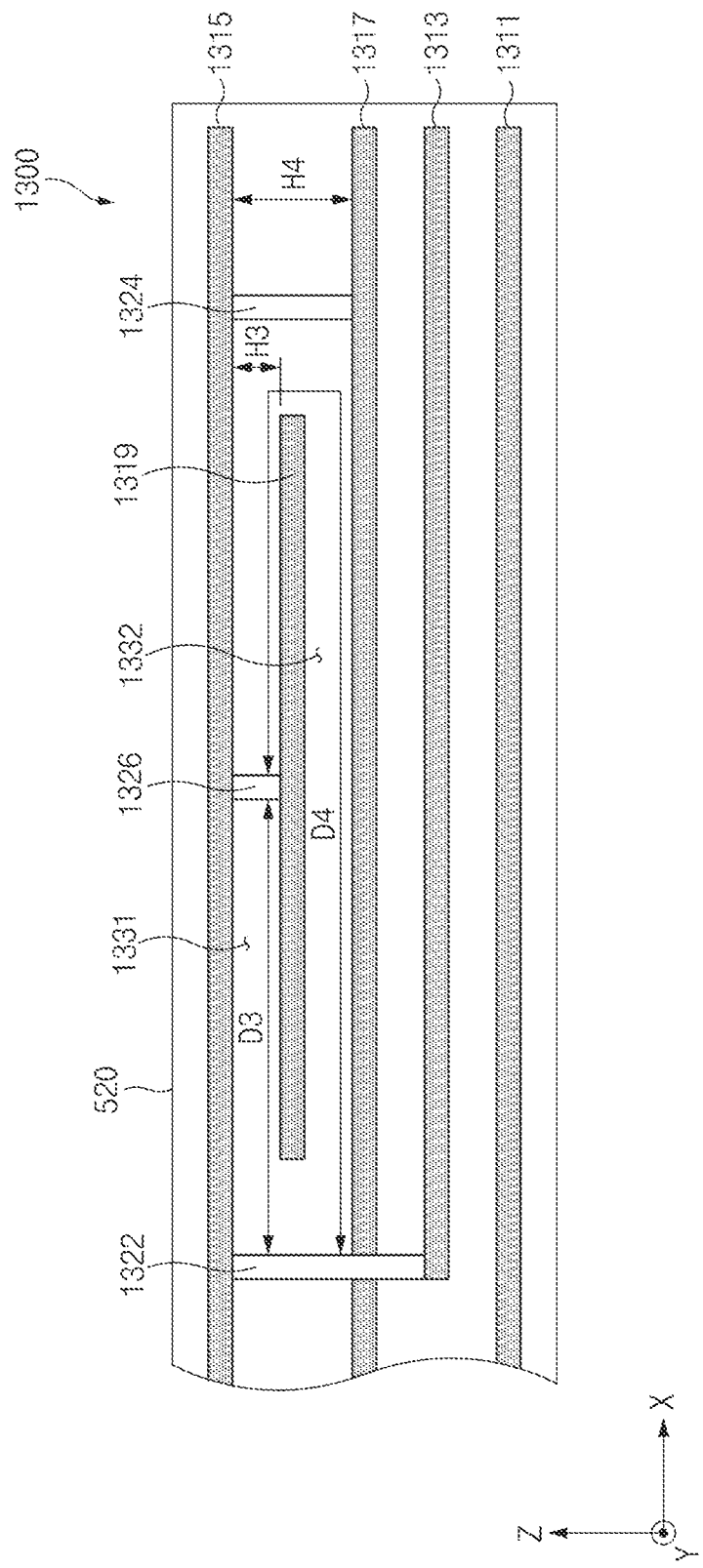
FIG. 13 is a cross-sectional view of a printed circuit board according to another embodiment.

FIG. 13 is a cross-sectional view 1300 of the printed circuit board 520 according to another embodiment. The printed circuit board 520 may include a plurality of conductive layers 1311, 1313, 1315, 1317, and 1319 and/or a plurality of via structures 1322, 1324, and 1326. A third shorting stub 1331 and a fourth shorting stub 1332 may be provided within the printed circuit board 520.

In an embodiment, the plurality of conductive layers 1311, 1313, 1315, 1317, and 1319 may include the ground layer 1311 (e.g., the second conductive layer 524 of FIG. 7B), the feeding line 1313 (e.g., the feeding line 5261 of FIG. 7B), the first conductive layer 1315, the third conductive layer 1317 (e.g., the third conductive layer 917 of FIG. 9), and/or the fourth conductive layer 1319 (e.g., the fourth conductive layer 919 of FIG. 7B). The plurality of via structures 1322, 1324, and 1326 may include the second conductive via 1322, the third side via 1324, and/or the fourth side via 1326.

In the embodiment, the ground layer 1311 may set a ground voltage or a reference voltage of the printed circuit board 520. The feeding line 1313 may be connected with and fed by a wireless communication circuit (e.g., the wireless communication circuit 590 of FIG. 7B). The feeding line 1313 may be connected with the first conductive layer 1315 through the second conductive via 1322.

In an embodiment, the first conductive layer 1315 may be fed through the second conductive via 1322. The first conductive layer 1315, the third conductive layer 1317, and the fourth conductive layer 1319 may form the third shorting stub 1331 and the fourth shorting stub 1332.

In an embodiment, the third shorting stub 1331 may have a third length D3. The fourth shorting stub 1332 may have a fourth length D4. The third length D3 may be a length that allows the third shorting stub 1331 to operate substantially as an open circuit in the first frequency band. The fourth length D4 may be a length that allows the fourth shorting stub 1332 to operate substantially as an open circuit in the second frequency band. For example, the third length D3 may be a quarter wave length of a signal belonging to the first frequency band, and the fourth length D4 may be a quarter wave length of a signal belonging to the second frequency band. In the case where the third length D3 is shorter than the fourth length D4, the first frequency band may be a frequency band to which a signal whose wavelength is shorter than that in the second frequency band belongs.

In an embodiment, lengths of the third shorting stub 1331 and the fourth shorting stub 1332 may be determined by the third side via 1324 and the fourth side via 1326, respectively. Positions of the third side via 1324 and the fourth side via 1326 may be set such that lengths of the third shorting stub 1331 and the fourth shorting stub 1332 are substantially the same as lengths of the open circuits at signals in the corresponding frequency bands.

In an embodiment, the fourth conductive layer 1319 may be spaced from the third side via 1324. The fourth shorting stub 1332 may not end at the fourth side via 1326, but it may extend to the remaining space of a space, which is formed by the third side via 1324, other than a space in which the third shorting stub 1331 is disposed. As such, the fourth length D4 of the fourth shorting stub 1332 may be increased without additionally increasing the size of the printed circuit board 520. In this case, the second frequency band transitioning at the fourth shorting stub 1332 may be adjusted.

In an embodiment, the third shorting stub 1331 may have a third height H3. The fourth shorting stub 1332 may have a fourth height H4 at a point where the fourth side via 1326 is located. As such, a bandwidth of the fourth shorting stub 1332 may be further increased by increasing the fourth height H4 of the fourth side via 1326.

Figure 14:
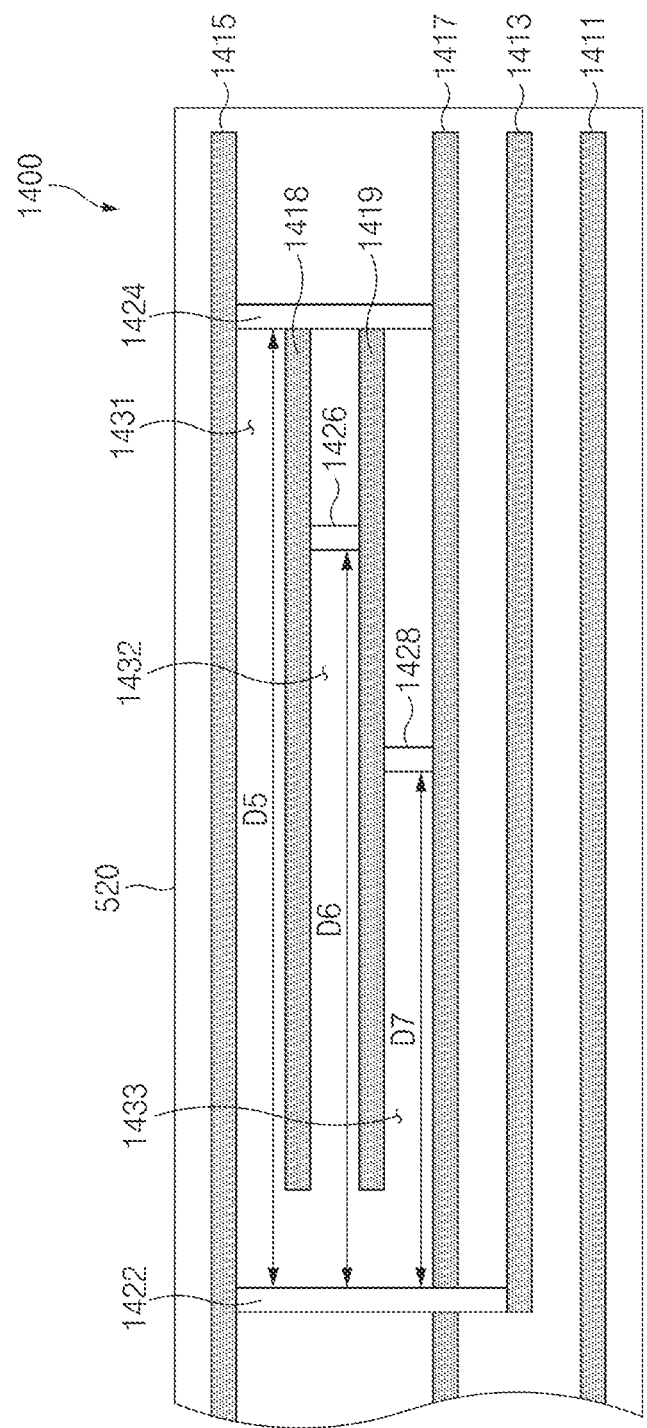
FIG. 14 is a cross-sectional view of a printed circuit board according to another embodiment.

FIG. 14 is a cross-sectional view 1400 of the printed circuit board 520 according to another embodiment. The printed circuit board 520 may include a plurality of conductive layers 1411, 1413, 1415, 1417, 1418, and 1419 and/or a plurality of vias structures 1422, 1424, 1426, and 1428. A first shorting stub 1431, a second shorting stub 1432, and a third shorting stub 1433 may be provided within the printed circuit board 520.

In an embodiment, the plurality of conductive layers 1411, 1413, 1415, 1417, 1418, and 1419 may include the ground layer 1411 (e.g., the second conductive layer 524 of FIG. 7B), the feeding line 1413 (e.g., the feeding line 5261 of FIG. 7B), the first conductive layer 1415, the third conductive layer 1417 (e.g., the third conductive layer 917 of FIG. 9), the fourth conductive layer 1418 (e.g., the fourth conductive layer 919 of FIG. 7B), and/or the fifth conductive layer 1419. The plurality of via structures 1422, 1424, 1426, and 1428 may include the third conductive via 1422, the fifth side via 1424, the sixth side via 1426, and/or the seventh side via 1428.

In the embodiment, the ground layer 1411 may set a ground voltage or a reference voltage of a printed circuit board. The feeding line 1413 may be connected with and fed by a wireless communication circuit (e.g., the wireless communication circuit 590 of FIG. 7B). The feeding line 1413 may be connected with the first conductive layer 1415 through the third conductive via 1422.

In an embodiment, the first conductive layer 1415 may be fed through the third conductive via 1422. The first conductive layer 1415, the third conductive layer 1417, the fourth conductive layer 1418, and the fifth conductive layer 1419 may form the fifth shorting stub 1431, the sixth shorting stub 1432, and the seventh shorting stub 1433.

In an embodiment, the fifth shorting stub 1431 may have a fifth length D5. The sixth shorting stub 1432 may have a sixth length D6. The seventh shorting stub 1433 may have a seventh length D7.

In an embodiment, lengths of the fifth shorting stub 1431, the sixth shorting stub 1432, and the seventh shorting stub 1433 may be determined by the fifth side via 1424, the sixth side via 1426, and/or the seventh side via 1428, respectively.

In an embodiment, the fifth shorting stub 1431, the sixth shorting stub 1432, and the seventh shorting stub 1433 may transition signals in different frequency bands. As such, an open circuit structure for signals in multiple frequency bands may be implemented. For example, there may be implemented a multi-open circuit structure in which the fifth shorting stub 1431 supports a transition of a signal in a low band, the sixth shorting stub 1432 supports a transition of a signal in a mid band, or the seventh shorting stub 1433 supports a transition of a signal in a high band. FIG. 14 shows an example in which a transition occurs in three bands. However, the disclosure is not limited thereto. For example, there may be implemented a multi-open circuit structure in which a transition occurs in three or more frequency bands, by vertically disposing three or more shorting stubs and circuitally connecting the shorting stubs in series.

Figure 15:
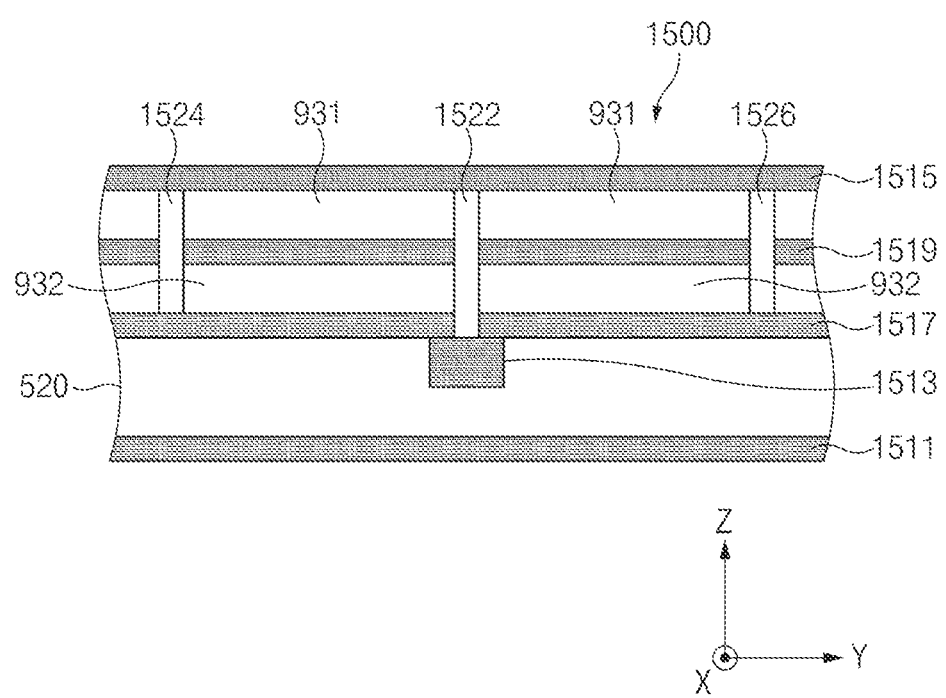
FIG. 15 is a side view of a printed circuit board according to an embodiment.

FIG. 15 is a side view 1500 of the printed circuit board 520 according to an embodiment. The printed circuit board 520 according to an embodiment may include a plurality of conductive layers 1511, 1513, 1515, 1517, and 1519, a fourth conductive via 1522, an eighth side via 1524, and/or a ninth side via 1526. The plurality of conductive layers 1511, 1513, 1515, 1517, and 1519 may include the ground layer 1511 (e.g., the second conductive layer 524 of FIG. 7B), the feeding line 1513 (e.g., the feeding line 5261 of FIG. 7B), the first conductive layer 1515, the third conductive layer 1517 (e.g., the third conductive layer 917 of FIG. 9), and/or the fourth conductive layer 1519 (e.g., the fourth conductive layer 919 of FIG. 7B).

In the embodiment, the ground layer 1511 may set a ground voltage or a reference voltage of a printed circuit board. The feeding line 1513 may be fed by a wireless communication circuit (e.g., the wireless communication circuit 590 of FIG. 7B). The feeding line 1513 may be connected with the first conductive layer 1515 through the fourth conductive via 1522.

In an embodiment, the first conductive layer 1515 may be fed through the fourth conductive via 1522. An electric field may be formed between the first conductive layer 1515 and the third conductive layer 1517. The first conductive layer 1515 and the third conductive layer 1517 may form a transmission line toward an aperture (e.g., the through hole 513 of FIG. 5A) with respect to a feeding part (e.g., a portion of the first conductive layer 1515, which is connected with the fourth conductive via 1522). The first conductive layer 1515 and the third conductive layer 1517 may form at least some of a plurality of shorting stubs (e.g., the first shorting stub 931 and the second shorting stub 932 of FIG. 9) for a signal transition, toward an opposite side of the aperture with respect to the feeding part.

In an embodiment, a space between the first conductive layer 1515 and the third conductive layer 1517 may be divided by using the fourth conductive layer 1519. The fourth conductive layer 1519, the eighth side via 1524, and the ninth side via 1526 may form the plurality of shorting stubs 931 and 932. As such, an open circuit structure for signals in multiple frequency bands may be implemented.

Figure 16:
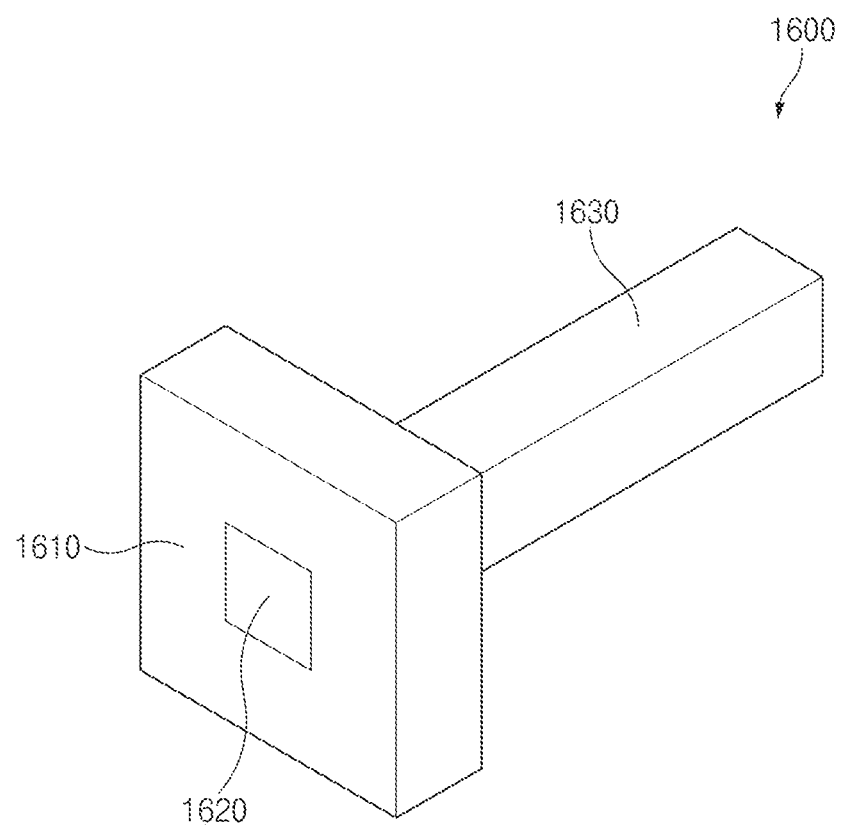
FIG. 16 is a perspective view of an antenna structure according to an embodiment.

FIG. 16 is a perspective view 1600 of an antenna structure according to an embodiment. An antenna structure may include a metal frame 1610, a through hole 1620 (e.g., the through hole 513 of FIG. 5A), and/or a printed circuit board 1630.

In an embodiment, the metal frame 1610 may radiate signals in multiple frequency bands. The metal frame 1610 may be in the shape of a horn capable of radiating a signal. The metal frame 1610 may be formed on at least a portion of the housing of the electronic device 101.

In an embodiment, the through hole 1620 may be defined on at least a portion of an outer area of the metal frame 1610. The through hole 1620 may be formed to pass through an outer surface and an inner surface of the metal frame 1610. An inner side of the through hole 1620 may be connected with the printed circuit board 1630. The through hole 1620 may be fed with signals from the printed circuit board 1630 such that the metal frame 1610 radiates signals in multiple frequency bands. The through hole 1620 may be filled with a dielectric being non-conductive.

In an embodiment, one side of the printed circuit board 1630 may be connected with the inner side of the through hole 1620. A plurality of shorting stubs (e.g., the first shorting stub 931 and the second shorting stub 932 of FIG. 9) for a transition of signals in multiple frequency bands may be formed within the printed circuit board 1630.

Figure 17:
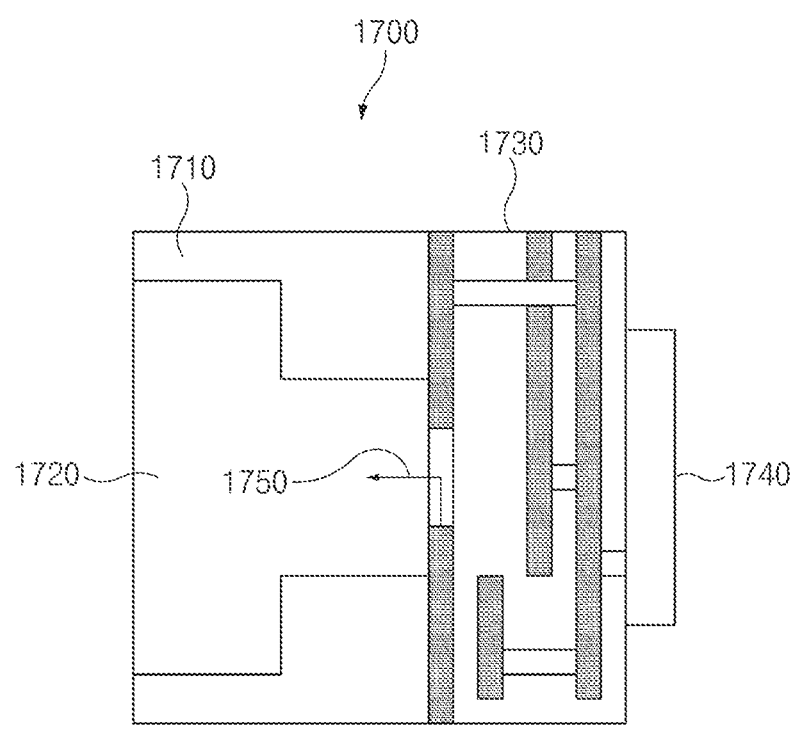
FIG. 17 is a side view of an antenna structure according to an embodiment.

FIG. 17 is a side view 1700 of an antenna structure according to an embodiment. An antenna structure may include a metal frame 1710, a through hole 1720 (e.g., the through hole 513 of FIG. 5A), a printed circuit board 1730, and/or a wireless communication circuit 1740.

In an embodiment, the through hole 1720 may be formed in the metal frame 1710. The through hole 1720 may be formed such that a radius of an outer side is greater than a radius of an inner side.

In an embodiment, the printed circuit board 1730 may be connected with an inner wall of the through hole 1720. For example, at least a portion of a surface of the printed circuit board 1730, which is opposite to a surface on which the wireless communication circuit 1740 is disposed, may be coupled to the inner wall of the metal frame 1710. The printed circuit board 1730 may be provided with a signal of a specified frequency from the wireless communication circuit 1740. The printed circuit board 1730 may transfer a signal toward the through hole 1720 by using a slit (e.g., the slit 5231 of FIG. 7B) formed to face the through hole 1720.

In an embodiment, open circuits or filters for a plurality of frequencies may be provided to prevent a signal from being propagated into the printed circuit board 1730. The printed circuit board 1730 may allow signals 1750 in multiple frequency bands, which are fed from the wireless communication circuit 1740, to transition so as to be transferred toward an aperture 1720. As such, the performance of radiation associated with a plurality of frequency bands may be improved.

In an embodiment, a plurality of shorting stubs (e.g., the first shorting stub 931 and the second shorting stub 932 of FIG. 9) for a transition of signals in multiple frequency bands may be formed within the printed circuit board 1730. The plurality of stubs 931 and 932 may perform a function of an open circuit or a filter with respect to a plurality of frequencies. As such, the performance of transferring fed signals in multiple frequency bands toward the through hole 1720 may be improved.

Figure 18A:
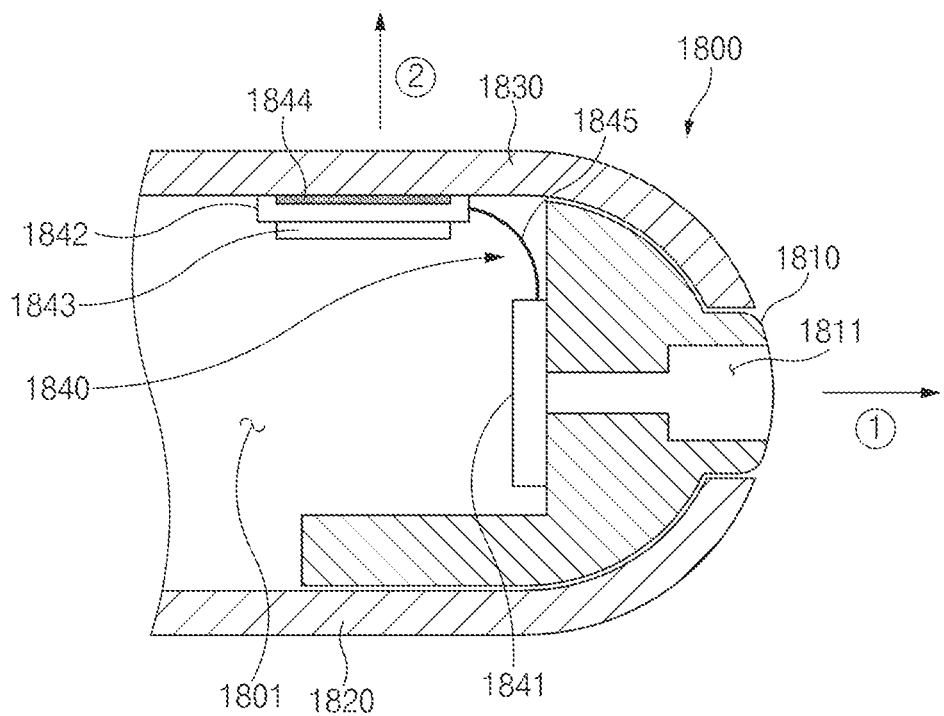
FIGS. 18 to 18C are cross-sectional views illustrating arrangement structures of antenna modules of electronic devices according to various embodiments of the disclosure.
Figure 18B:
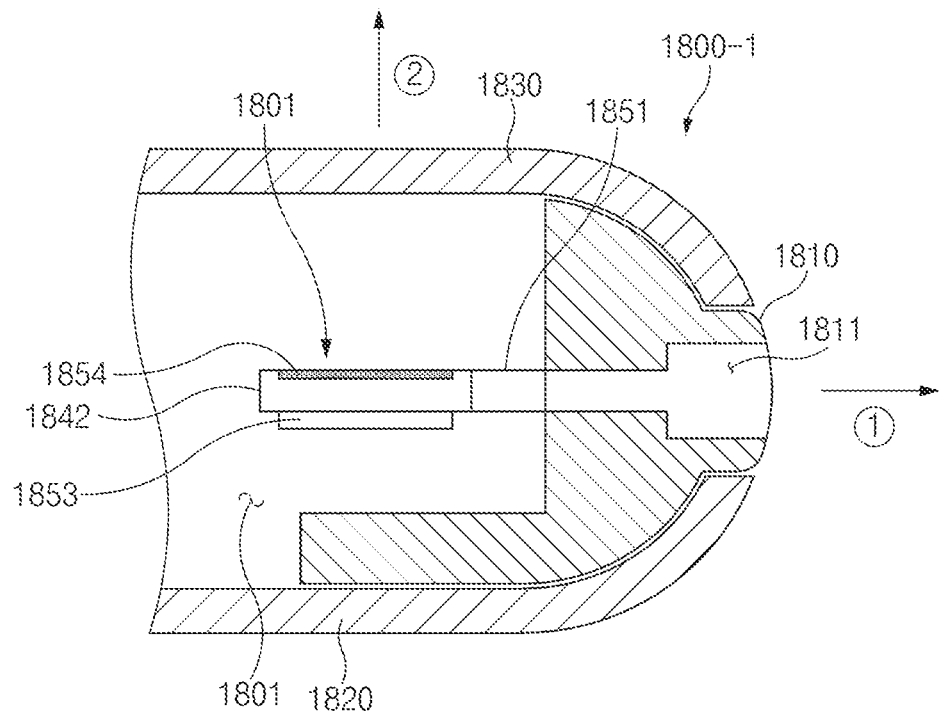
Figure 18C:
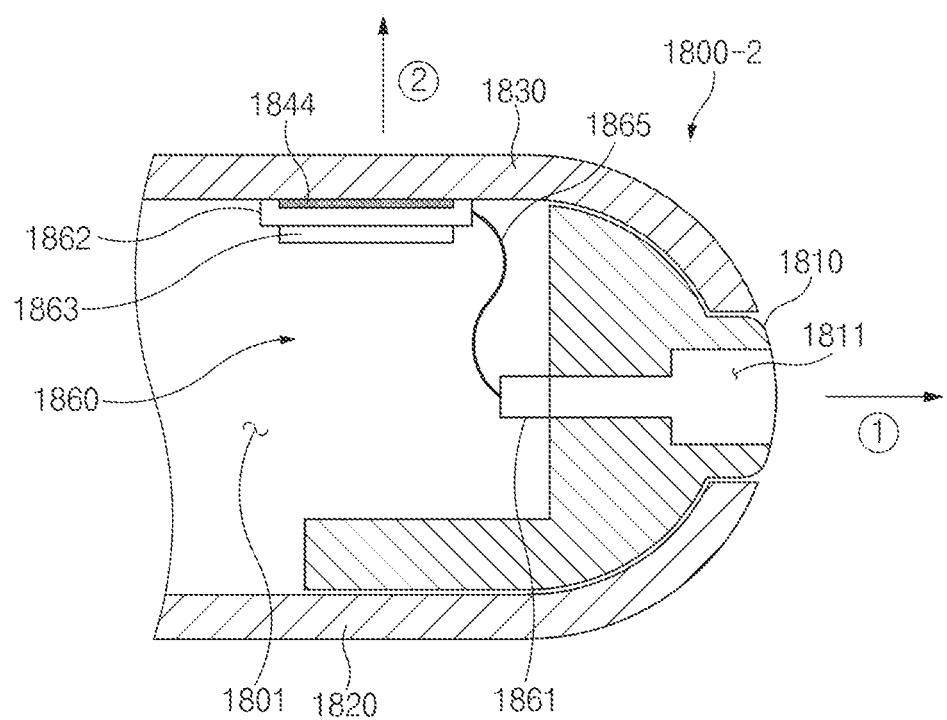

FIGS. 18A to 18C are cross-sectional views illustrating arrangement structures of antenna modules 1840, 1850, and 1860 (e.g., the antenna module 500 of FIG. 5A) of electronic devices 1800, 1800-1, and 1800-2 (e.g., the electronic device 101 of FIG. 1) according to various embodiments of the disclosure.

Referring to FIG. 18A, an electronic device 1800 may include a first plate 1820, a second plate 1830 facing away from the first plate 1820, and the side member 1810 surrounding a space 1801 between the first plate 1820 and the second plate 1830. The side member 1810 may include a through hole 1811 (e.g., the through hole 513 of FIG. 5A) as part of a horn waveguide structure in which signals in multiple frequency bands are transmitted and/or received.

In an embodiment, the antenna module 1840 may include a first printed circuit board 1841 (e.g., the printed circuit board 700 of FIG. 7B) disposed in the inner space 1801 of the electronic device 1800 so as to make contact with the side member 1810, a second printed circuit board 1842 disposed to be spaced from the first printed circuit board 1841, and a conductive cable 1845 (e.g., a flexible printed circuit board (FPCB)) electrically connecting the second printed circuit board 1842 and the first printed circuit board 1841. A slit (e.g., the slit 5231 of FIG. 7B) may be formed on one surface of the first printed circuit board 1841. The slit 5231 may make contact with the side member 1810 so as to face the through hole 1811.

In an embodiment, the second printed circuit board 1842 may include a conductive patch antenna 1844 disposed on one surface of the second printed circuit board 1842, and a wireless communication circuit 1843 disposed on a surface of the second printed circuit board 1842, which faces away from the one surface. The second printed circuit board 1842 may be disposed in a direction parallel to the second plate 1830. The antenna module 1840 may form a beam pattern in a lateral direction (i.e., direction ①) through the slit 5231 of the first printed circuit board 1841 and the through hole 1811 and/or may form a beam pattern in a direction (i.e., direction ②), which the second plate 1830 faces, through the conductive patch antenna 1844.

Referring to FIG. 18B, the antenna module 1850 may include a first printed circuit board 1851 (e.g., the printed circuit board 700 of FIG. 7B) disposed in the inner space 1801 of the electronic device 1800-1 so as to make contact with the side member 1810, and a second printed circuit board 1852 disposed to extend from the first printed circuit board 1851 in a direction parallel to the second plate 1830. For example, the first printed circuit board 1851 and the second printed circuit board 1852 may be implemented with one printed circuit board. A first area (e.g., the first area A1 of FIG. 7A) may be formed on one side surface of the first printed circuit board 1851, and the one side surface may make contact with the side member 1810 such that the first area A1 faces the through hole 1811.

In an embodiment, the second printed circuit board 1852 may include a conductive patch antenna 1854 disposed on one surface of the second printed circuit board 1852, and a wireless communication circuit 1853 disposed on a surface of the second printed circuit board 1852, which faces away from the one surface. Accordingly, the antenna module 1850 may form a beam pattern in a lateral direction (i.e., direction ①) through the first area A1 of the first printed circuit board 1851 and the through hole 1811 and/or may form a beam pattern in a direction (i.e., direction ②), which the second plate 1830 faces, through the conductive patch antenna 1854.

Referring to FIG. 18C, the antenna module 1860 may include a first printed circuit board 1861 (e.g., the printed circuit board 700 of FIG. 7B) disposed in the inner space 1801 of the electronic device 1800-2 so as to make contact with the side member 1810, a second printed circuit board 1862 disposed to be spaced from the first printed circuit board 1861, and a conductive cable 1865 (e.g., a flexible printed circuit board (FPCB)) electrically connecting the second printed circuit board 1862 and the first printed circuit board 1861. A first area (e.g., the first area A1 of FIG. 7A) may be formed on one side surface of the first printed circuit board 1861, and the one side surface of the first printed circuit board 1861 may make contact with the side member 1810 such that the first area A1 faces the through hole 1811.

In an embodiment, the second printed circuit board 1862 may include a conductive patch antenna 1864 disposed on one surface of the second printed circuit board 1862, and a wireless communication circuit 1863 disposed on a surface of the second printed circuit board 1862, which faces away from the one surface. The second printed circuit board 1862 may be disposed in a direction parallel to the second plate 1830. The antenna module 1860 may form a beam pattern in a lateral direction (i.e., direction ①) through the first area A1 of the first printed circuit board 1861 and the through hole 1811 and/or may form a beam pattern in a direction (i.e., direction ②), which the second plate 1830 faces, through the conductive patch antenna 1864.

In an embodiment, as illustrated in FIG. 17, the printed circuit board 1730 may be vertically mounted in the electronic device 101. For another example, as illustrated in FIG. 18A, the first printed circuit board 1841 may be vertically mounted separately. For another example, as illustrated in FIG. 18B, the first printed circuit board 1841 may be horizontally coupled to the side member 1810. For another example, as illustrated in FIG. 18C, the first printed circuit board 1841 may be horizontally coupled to the side member 1810 separately. As such, a printed circuit board (e.g., the printed circuit board 700 of FIG. 7B) may be mounted in the electronic device 101 in various manners and/or structures.

An electronic device (e.g., the electronic device 101 of FIG. 1) according to various embodiments may include a housing that includes a first plate (e.g., the first plate 1820 of FIG. 18A), a second plate (e.g., the second plate 1830 of FIG. 18A) facing away from the first plate 1820, and a side member (e.g., the side member 510 of FIG. 5A) surrounding a space (e.g., the space 1801 of FIG. 18A) between the first plate 1820 and the second plate 1830, connected with the second plate 1830 or integrally formed with the second plate 1830, and including a conductive material, a first portion (e.g., the first portion P1 of FIG. 5A) of the side member 510 including a first surface (e.g., the first surface 511 of FIG. 5A) facing an exterior of the housing, a second surface (e.g., the second surface 512 of FIG. 5A) facing an interior of the housing, a through hole (e.g., the through hole 513 of FIG. 5A) formed in a first direction (e.g., a Y-axis direction of FIG. 5A) being a direction passing through the side member 510 from the first surface 511 to the second surface 512, and a non-conductive material inserted into the through hole 513, a display that is viewable through at least a portion of the first plate 1820, a printed circuit board (e.g., the printed circuit board 520 of FIG. 5A) that is disposed in the interior of the housing, the printed circuit board 520 including a third surface (e.g., the third surface 521 of FIG. 5A) facing the second surface 512, a fourth surface (e.g., the fourth surface 522 of FIG. 5A) facing away from the third surface 521, a first conductive layer (e.g., the first conductive layer 523) disposed closer to the third surface 521 than to the fourth surface 522 and including a slit (e.g., the slit 5231 of FIG. 7A) formed to face the through hole 513, a second conductive layer (e.g., the second conductive layer 523 of FIG. 7B) disposed closer to the fourth surface 522 than to the first conductive layer 523, a feeding line (e.g., the feeding line 5261 of FIG. 7B) interposed between the first conductive layer 523 and the second conductive layer 524, a conductive pattern (e.g., the conductive pattern 5263 of FIG. 7B) interposed between the feeding line 5261 and the first conductive layer 523 and electrically coupled with the first conductive layer 523, a conductive via (e.g., the conductive via 526 of FIG. 7B) connecting the feeding line 5261 and the conductive pattern 5263, a third conductive layer (e.g., the third conductive layer 5241 of FIG. 7B) interposed between the first conductive layer 523 and the second conductive layer 524, a fourth conductive layer (e.g., the fourth conductive layer 919 of FIG. 7B) interposed between the first conductive layer 523 and the third conductive layer 5241, a plurality of first side vias (e.g., the first side vias 924 of FIG. 7B) electrically connecting the first conductive layer 523 and the third conductive layer 5241 and formed to be spaced from the conductive via 526 in a second direction (e.g., an X-axis direction of FIG. 7B), which is perpendicular to the first direction (e.g., the Y-axis direction) and is a direction facing away from the through hole 513 and the slit 5231, as much as a first distance (e.g., the first distance D1 of FIG. 7B), and a plurality of second side vias (e.g., the second side vias 926 of FIG. 7B) electrically connecting the third conductive layer 5241 and the fourth conductive layer 919 and formed to be spaced from the conductive via 526 in the second direction (i.e., the X-axis direction) as much as a second distance (e.g., the second distance D2 of FIG. 7B) different from the first distance D1, and a wireless communication circuit (e.g., the wireless communication circuit 590 of FIG. 7B) that is electrically connected with the feeding line 5261 and transmits and/or receives signals each having a frequency between 3 GHz and 100 GHz.

In an embodiment, the printed circuit board 520 may include a first shorting stub (e.g., the first shorting stub 931 of FIG. 7B) that is formed between the first conductive layer 523 and the fourth conductive layer 919 and transitions a first signal belonging to a first frequency band from among the signals so as to be transferred to the through hole 513 of the side member 510, and a second shorting stub (e.g., the second shorting stub 932 of FIG. 7B) that is formed between the third conductive layer 5241 and the fourth conductive layer 919 and transitions a second signal belonging to a second frequency band different from the first frequency band from among the signals so as to be transferred to the through hole 513.

In an embodiment, the first and second shorting stubs 931 and 932 may form a double open circuit (e.g., the double open circuit 1040 of FIG. 10), the first shorting stub 931 may be a band-stop filter (e.g., the first filter 1041 of FIG. 10) blocking the first frequency band, and the second shorting stub 932 may be a band-stop filter (e.g., the second filter 1042 of FIG. 10) blocking the second frequency band.

In an embodiment, the plurality of first side vias 924 may be spaced as much as the first distance D1 to allow the wireless communication circuit 590 to transmit and/or receive the first signal belonging to the first frequency band, and the plurality of second side vias 926 are spaced as much as the second distance D2 to allow the wireless communication circuit 590 to transmit and/or receive the second signal belonging to the second frequency band.

In an embodiment, an antenna radiator (e.g., the antenna radiator 1030 of FIG. 10) of a horn shape may be formed at the side member 510.

In an embodiment, the side member 510 and the printed circuit board 520 may be connected to each other by using the through hole 513 and the slit 5231.

In an embodiment, the first distance D1 may have a quarter wave length for the first signal, and the second distance D2 may have a quarter wave length for the second signal.

In an embodiment, bandwidths of the first and second signals may be set depending on heights of the first and second shorting stubs 931 and 932.

An electronic device 101 according to various embodiments may include a housing that includes a first plate 1820, a second plate 1830 facing away from the first plate 1820, and a side member 510 surrounding a space 1801 between the first plate 1820 and the second plate 1830, connected with the second plate 1830 or integrally formed with the second plate 1830, and including a conductive material, wherein a first portion P1 of the side member 510 includes a first surface 511 facing an exterior of the housing and a second surface 512 facing away from the first surface, a printed circuit board 520 disposed in the interior of the housing, wherein the printed circuit board 520 includes a third surface 521 facing the second surface 512, a fourth surface 522 facing away from the third surface 521, a first conductive layer (e.g., the first conductive layer 1315 of FIG. 13) disposed closer to the third surface 521 than to the fourth surface 522 and in which a through hole is formed in a first direction (i.e., a Y-axis direction), a second conductive layer (e.g., the ground layer 1311 of FIG. 13) disposed closer to the fourth surface 522 than to the first conductive layer 1315, a feeding line (e.g., the feeding line 1313 of FIG. 13) interposed between the first conductive layer 1315 and the second conductive layer 1311, a conductive via (e.g., the conductive via 1322 of FIG. 13) connecting the feeding line 1313 and the first conductive layer 1315, a third conductive layer (e.g., the third conductive layer 1317 of FIG. 13) interposed between the first conductive layer 1315 and the second conductive layer 1311, a fourth conductive layer (e.g., the fourth conductive layer 1319 of FIG. 13) interposed between the first conductive layer 1315 and the third conductive layer 1317, a plurality of third side vias (e.g., the third side vias 1324 of FIG. 13) electrically connecting the first conductive layer 1315 and the third conductive layer 1317, formed to be spaced from the conductive via 1322 in a second direction (i.e., an X-axis direction), which is perpendicular to the first direction (i.e., the Y-axis direction) and is a direction facing away from the through hole, and formed to be spaced from the fourth conductive layer 1319, and a plurality of fourth side vias (e.g., the fourth side vias 1326 of FIG. 13) electrically connecting the first conductive layer 1315 and the fourth conductive layer 1319, spaced from the conductive via 1322 in the second direction (i.e., the X-axis direction), and formed more adjacent to the conductive via 1322 than the plurality of third side vias 1324, and a wireless communication circuit 590 that is electrically connected with the feeding line 1313 and transmits and/or receives signals each having a frequency between 3 GHz and 100 GHz.

In an embodiment, the plurality of third side vias 1324 and the plurality of fourth side vias may set lengths of a third shorting stub (e.g., the third shorting stub 1331 of FIG. 13), which prevents a signal in a first frequency band from being transferred to the printed circuit board 520, and a fourth shorting stub (e.g., the fourth shorting stub 1332 of FIG. 13), which prevents a signal in a second frequency band different from the first frequency band from being transferred to the printed circuit board 520.

In an embodiment, the third shorting stub 1331 may be disposed in the printed circuit board 520 in the second direction (i.e., the X-axis direction), and the fourth shorting stub 1332 may be disposed in the printed circuit board 520 so as to extend in the second direction (i.e., the X-axis direction), to then extend in the first direction (i.e., a Z-axis direction), and to again extend in the second direction (i.e., the X-axis direction).

In an embodiment, the third shorting stub 1331 may have a third length (e.g., the third length D3 of FIG. 13) in the second direction (i.e., the X-axis direction) between the conductive via 1322 and the plurality of fourth side vias 1326, the fourth shorting stub 1332 may extend in the second direction (i.e., the X-axis direction), may then extend in the first direction (i.e., the Z-axis direction), and may again extend in the second direction (i.e., the X-axis direction), so as to have a fourth length (e.g., the fourth length D4 of FIG. 13) between the conductive via 1322 and the plurality of fourth side vias 1326, the third length D3 may be a quarter wave length of the first frequency band, and the fourth length D4 may be a quarter wave length of the second frequency band.

In an embodiment, the electronic device may further include a fifth conductive layer (e.g., the fifth conductive layer 1419 of FIG. 14) interposed between the third conductive layer (e.g., the third conductive layer 1417 of FIG. 14) and the fourth conductive layer (e.g., the fourth conductive layer 1418 of FIG. 14), and a plurality of seventh side vias (e.g., the seventh side vias 1428 of FIG. 14) interposed between the third conductive layer 1417 and the fifth conductive layer 1419.

In an embodiment, the first conductive layer 1315 may include a slit 5231 facing the through hole 513, and the slit 5231 may be connected with the through hole 513 of the side member 510 to transfer signals belonging to the first frequency band and the second frequency band to the through hole 513.

In an embodiment, the third shorting stub 1331 may operate as an open circuit or a band-stop filter in the first frequency band, and the fourth shorting stub 1332 may operate as an open circuit or a band-stop filter in the second frequency band.

An electronic device (e.g., the electronic device 101) according to various embodiments may include a printed circuit board 520 that is disposed in the electronic device 101, and at least one wireless communication circuit 590 that is electrically connected with the printed circuit board 520 and transmits and/or receives signals each having a frequency between 3 GHz and 100 GHz. The printed circuit board 520 may include a third surface 521 that is adjacent to an outer surface of the electronic device 101, a fourth surface 522 that faces away from the third surface 521, a first conductive layer 523 that is disposed closer to the third surface 521 than to the fourth surface 522 and in which a through hole 513 is formed in a first direction (i.e., a Y-axis direction), a second conductive layer 524 that is disposed closer to the fourth surface 522 than to the first conductive layer 523, a feeding line 5261 that is interposed between the first conductive layer 523 and the second conductive layer 524, a conductive pattern 5263 that is interposed between the feeding line 5261 and the first conductive layer 523 and is electrically coupled with the first conductive layer 523, a conductive via 526 that connects the feeding line 5261 and the conductive pattern 5263, a third conductive layer 5241 that is interposed between the first conductive layer 523 and the second conductive layer 524, a fourth conductive layer 919 that is interposed between the first conductive layer 523 and the third conductive layer 5241, a first shorting stub 931 that has a first distance D1 from the conductive via 526 in a second direction (i.e., an X-axis direction) being perpendicular to the first direction D1 and facing away from the through hole 513, and a second shorting stub 932 that has a second distance D2 different from the first distance D1 from the conductive via 526 in the second direction (i.e., a Y-axis direction).

In an embodiment, the first shorting stub 931 may have a first height (e.g., the first height H1 of FIG. 8) in the first direction (i.e., a Z-axis direction), the second shorting stub 932 may have a second height (e.g., the second height H2 of FIG. 8) in the first direction (i.e., the Z-axis direction), a bandwidth of a first signal that the first shorting stub 931 transitions may be set depending on the first height H1, and a bandwidth of a second signal that the second shorting stub transitions may be set depending on the second height H2.

In an embodiment, a length of the first shorting stub 931 may be set by a plurality of first side vias 924 electrically connecting the first conductive layer 523 and the third conductive layer 5241, and a length of the second shorting stub may be set by a plurality of second side vias 926 electrically connecting the third conductive layer 5241 and the fourth conductive layer 919.

In an embodiment, the first shorting stub 931 may transfer a first signal belonging to a first frequency band to the through hole 513, and the second shorting stub 932 may transfer a second signal belonging to a second frequency band different from the first frequency band to the through hole 513.

In an embodiment, the wireless communication circuit 590 may transmit and/or receive signals in the first frequency band and the second frequency band by using the first signal and the second signal transferred to the through hole 513.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
   a housing including a first plate, a second plate facing away from the first plate, and a side member surrounding a space between the first plate and the second plate, connected with the second plate or integrally formed with the second plate, and including a conductive material,
   wherein a first portion of the side member includes:
   a first surface facing an exterior of the housing;
   a second surface facing an interior of the housing;
   a through hole formed in a first direction being a direction passing through the side member from the first surface to the second surface; and
   a non-conductive material inserted into the through hole;
   a display viewable through at least a portion of the first plate;
   a printed circuit board disposed in the interior of the housing, wherein the printed circuit board includes:
   a third surface facing the second surface;
   a fourth surface facing away from the third surface;
   a first conductive layer disposed closer to the third surface than to the fourth surface and including a slit formed to face the through hole;
   a second conductive layer disposed closer to the fourth surface than to the first conductive layer;
   a feeding line interposed between the first conductive layer and the second conductive layer;
   a conductive pattern interposed between the feeding line and the first conductive layer and electrically coupled with the first conductive layer;
   a conductive via connecting the feeding line and the conductive pattern;
   a third conductive layer interposed between the first conductive layer and the second conductive layer;
   a fourth conductive layer interposed between the first conductive layer and the third conductive layer;
   a plurality of first side vias electrically connecting the first conductive layer and the third conductive layer and formed to be spaced from the conductive via in a second direction, which is perpendicular to the first direction and is a direction facing away from the through hole and the slit, as much as a first distance; and
   a plurality of second side vias electrically connecting the third conductive layer and the fourth conductive layer and formed to be spaced from the conductive via in the second direction as much as a second distance different from the first distance; and
   a wireless communication circuit electrically connected with the feeding line, and configured to transmit and/or receive signals each having a frequency between 3 GHz and 100 GHz.

2. The electronic device of claim 1, wherein the printed circuit board includes:
   a first shorting stub formed between the first conductive layer and the fourth conductive layer and configured to transition a first signal belonging to a first frequency band from among the signals so as to be transferred to the through hole of the side member; and
   a second shorting stub formed between the third conductive layer and the fourth conductive layer and configured to transition a second signal belonging to a second frequency band different from the first frequency band from among the signals so as to be transferred to the through hole.

3. The electronic device of claim 2, wherein the first and second shorting stubs form a double open circuit,
   wherein the first shorting stub is a band-stop filter blocking the first frequency band, and
   wherein the second shorting stub is a band-stop filter blocking the second frequency band.

4. The electronic device of claim 2, wherein the plurality of first side vias are spaced as much as the first distance to allow the wireless communication circuit to transmit and/or receive the first signal belonging to the first frequency band, and
   wherein the plurality of second side vias are spaced as much as the second distance to allow the wireless communication circuit to transmit and/or receive the second signal belonging to the second frequency band.

5. The electronic device of claim 1, wherein an antenna radiator of a horn shape is formed at the side member.

6. The electronic device of claim 1, wherein the side member and the printed circuit board are connected to each other by using the through hole and the slit.

7. The electronic device of claim 2, wherein the first distance has a quarter wave length for the first signal, and
   wherein the second distance has a quarter wave length for the second signal.

8. The electronic device of claim 2, wherein bandwidths of the first and second signals are set depending on heights of the first and second shorting stubs.

9. An electronic device comprising:
   a housing including a first plate, a second plate facing away from the first plate, and a side member surrounding a space between the first plate and the second plate, connected with the second plate or integrally formed with the second plate, and including a conductive material,
   wherein a first portion of the side member includes:
   a first surface facing an exterior of the housing, and a second surface facing away from the first surface;
   a printed circuit board disposed in the interior of the housing,
   wherein the printed circuit board includes:
   a third surface facing the second surface;
   a fourth surface facing away from the third surface;
   a first conductive layer disposed closer to the third surface than to the fourth surface and in which a through hole is formed in a first direction;
   a second conductive layer disposed closer to the fourth surface than to the first conductive layer;
   a feeding line interposed between the first conductive layer and the second conductive layer;

a conductive via connecting the feeding line and the first conductive layer;

a third conductive layer interposed between the first conductive layer and the second conductive layer;

a fourth conductive layer interposed between the first conductive layer and the third conductive layer;

a plurality of third side vias electrically connecting the first conductive layer and the third conductive layer, formed to be spaced from the conductive via in a second direction, which is perpendicular to the first direction and is a direction facing away from the through hole, and formed to be spaced from the fourth conductive layer; and a plurality of fourth side vias electrically connecting the first conductive layer and the fourth conductive layer, spaced from the conductive via in the second direction, and formed more adjacent to the conductive via than the plurality of third side vias; and a wireless communication circuit electrically connected with the feeding line, and configured to transmit and/or receive signals each having a frequency between 3 GHz and 100 GHz.

10. The electronic device of claim 9, wherein the plurality of third side vias and the plurality of fourth side vias set lengths of a third shorting stub, which prevents a signal in a first frequency band from being transferred to the printed circuit board, and a fourth shorting stub, which prevents a signal in a second frequency band different from the first frequency band from being transferred to the printed circuit board.

11. The electronic device of claim 10, wherein the third shorting stub is disposed in the printed circuit board in the second direction, and wherein the fourth shorting stub is disposed in the printed circuit board so as to extend in the second direction, to then extend in the first direction, and to again extend in the second direction.

12. The electronic device of claim 10, wherein the third shorting stub has a third length in the second direction between the conductive via and the plurality of fourth side vias, wherein the fourth shorting stub extends in the second direction, then extends in the first direction, and again extends in the second direction, so as to have a fourth length between the conductive via and the plurality of fourth side vias, wherein the third length is a quarter wave length of the first frequency band, and wherein the fourth length is a quarter wave length of the second frequency band.

13. The electronic device of claim 10, further comprising:

a fifth conductive layer interposed between the third conductive layer and the fourth conductive layer; and a plurality of seventh side vias interposed between the third conductive layer and the fifth conductive layer.

14. The electronic device of claim 9, wherein the first conductive layer includes a slit facing the through hole, and wherein the slit is connected with the through hole of the side member to transfer signals belonging to the first frequency band and the second frequency band to the through hole.

15. The electronic device of claim 10, wherein the third shorting stub operates as an open circuit or a band-stop filter in the first frequency band, and wherein the fourth shorting stub operates as an open circuit or a band-stop filter in the second frequency band.

* * * * *